(12) United States Patent
Lee

(10) Patent No.: US 11,925,018 B2
(45) Date of Patent: Mar. 5, 2024

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 303 days.

(21) Appl. No.: 17/307,756

(22) Filed: May 4, 2021

(65) Prior Publication Data

US 2022/0139939 A1    May 5, 2022

(30) Foreign Application Priority Data

Nov. 4, 2020  (KR) .................. 10-2020-0146321

(51) Int. Cl.
| | | |
|---|---|---|
| *H10B 41/35* | (2023.01) | |
| *H10B 41/10* | (2023.01) | |
| *H10B 41/20* | (2023.01) | |
| *H10B 43/10* | (2023.01) | |
| *H10B 43/20* | (2023.01) | |
| *H10B 43/35* | (2023.01) | |

(52) U.S. Cl.
CPC ............ *H10B 41/35* (2023.02); *H10B 41/10* (2023.02); *H10B 41/20* (2023.02); *H10B 43/10* (2023.02); *H10B 43/20* (2023.02); *H10B 43/35* (2023.02)

(58) Field of Classification Search
CPC ........ H10B 41/35; H10B 41/10; H10B 41/20; H10B 43/10; H10B 43/20; H10B 43/35; H10B 43/27; H10B 43/40; H10B 43/30; H10B 43/50; H01L 2224/05556; H01L 24/08; H01L 24/80; H01L 2224/08058; H01L 2224/08145; H01L 2224/80357; H01L 2224/80895; H01L 2224/80896; H01L 21/76897; H01L 23/5386; H01L 24/05; H01L 25/0657
See application file for complete search history.

(56) References Cited

U.S. PATENT DOCUMENTS

| | | | | |
|---|---|---|---|---|
| 10,665,581 | B1 * | 5/2020 | Zhou | .................. H01L 27/0688 |
| 10,840,261 | B2 * | 11/2020 | Ito | ......................... H10B 43/40 |
| 11,417,675 | B2 * | 8/2022 | Jang | .................. H01L 21/76805 |
| 2020/0402991 | A1 * | 12/2020 | Jung | ..................... H10B 43/35 |

FOREIGN PATENT DOCUMENTS

KR          101567024 B1     11/2015

* cited by examiner

*Primary Examiner* — Shahed Ahmed
*Assistant Examiner* — Khatib A Rahman
(74) *Attorney, Agent, or Firm* — William Park & Associates Ltd.

(57) ABSTRACT

A semiconductor device includes a stacked body including a conductive pattern and an insulating pattern, a cell plug passing through the stacked body, a semiconductor layer, a peripheral transistor arranged on the semiconductor layer, a first conductor coupling the peripheral transistor to the cell plug, a second conductor coupled to the conductive pattern, a pass plug coupled to the second conductor, and a pass gate surrounding the pass plug, wherein the pass gate is arranged at substantially a same level as the semiconductor layer.

21 Claims, 21 Drawing Sheets

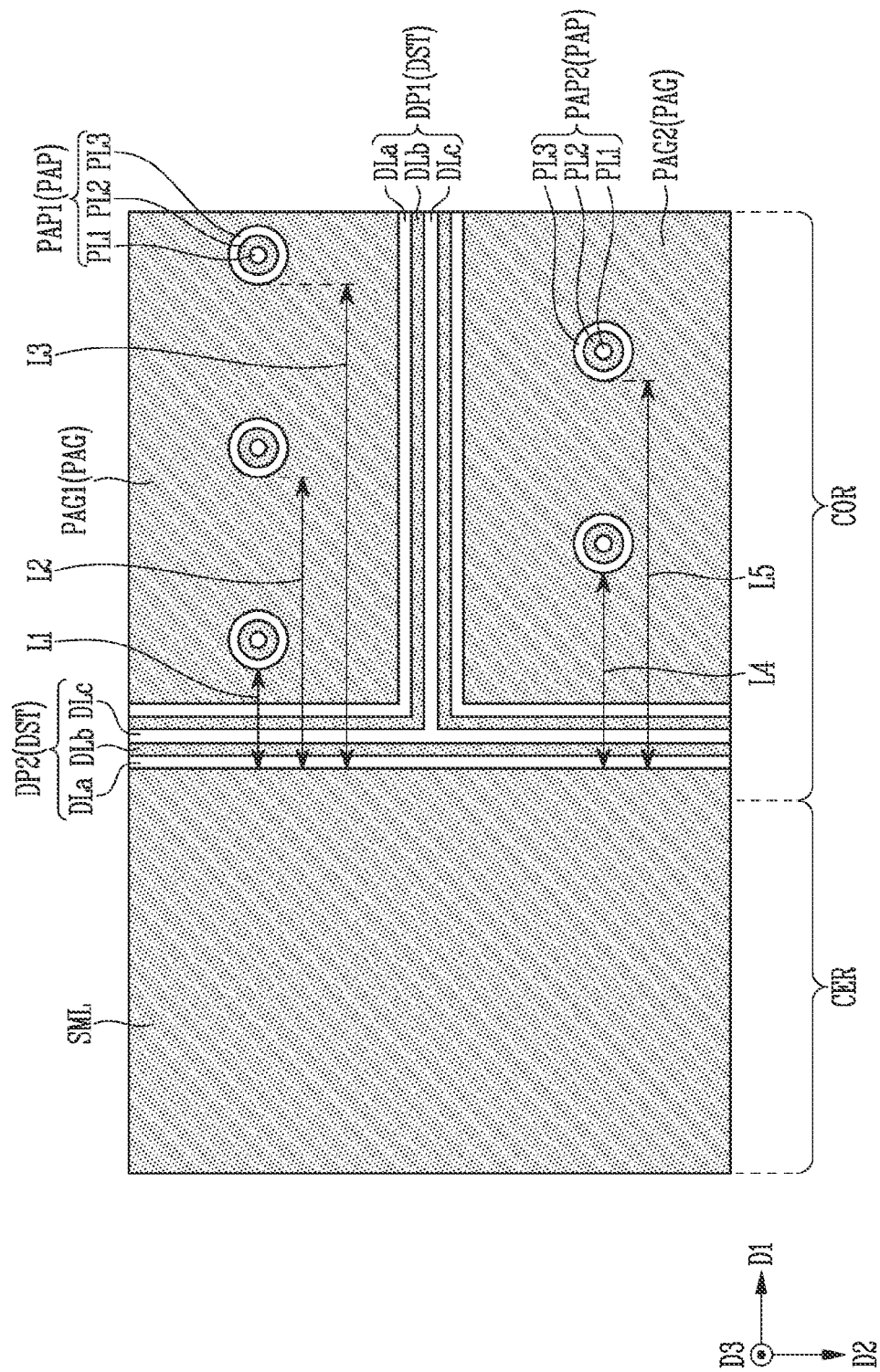

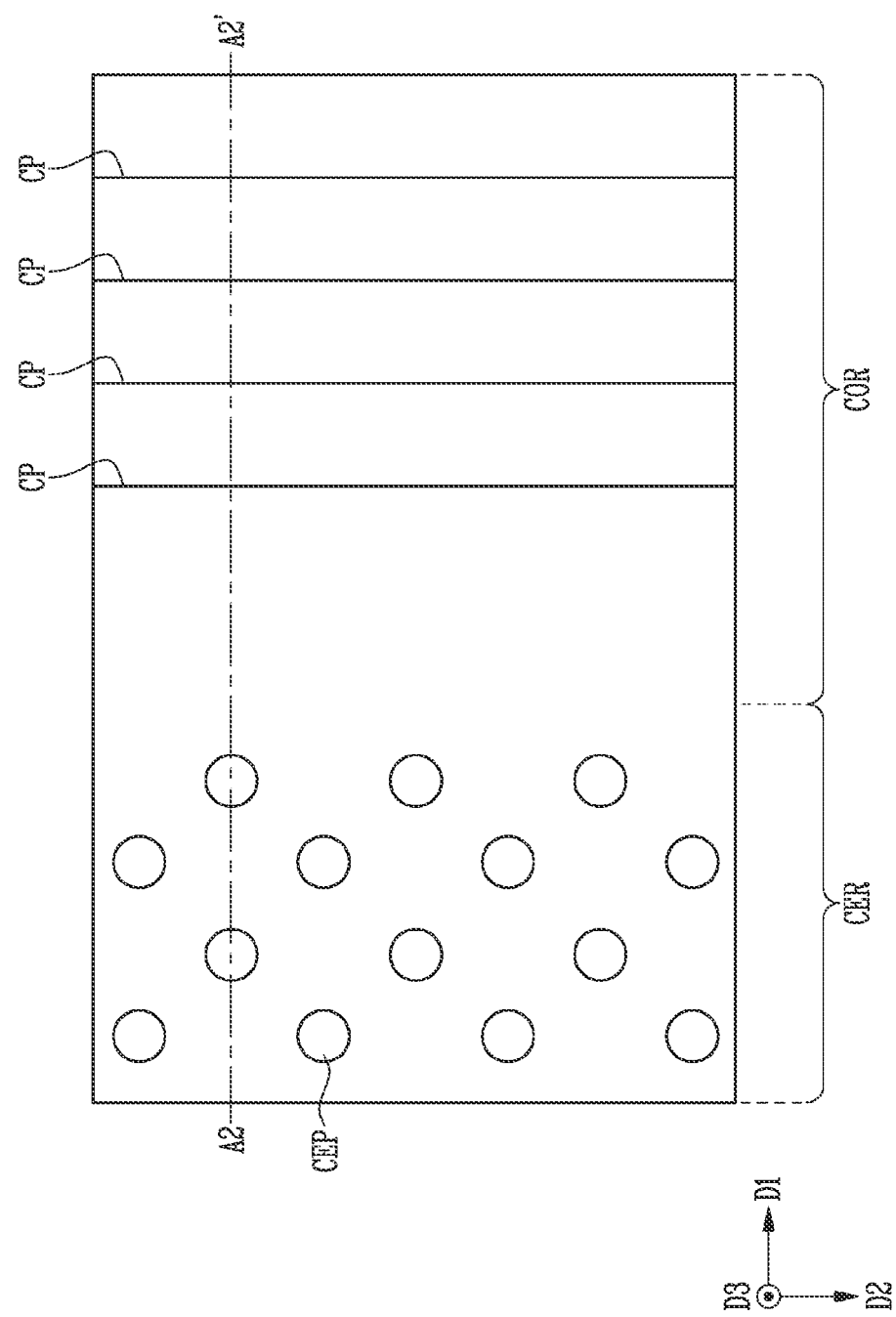

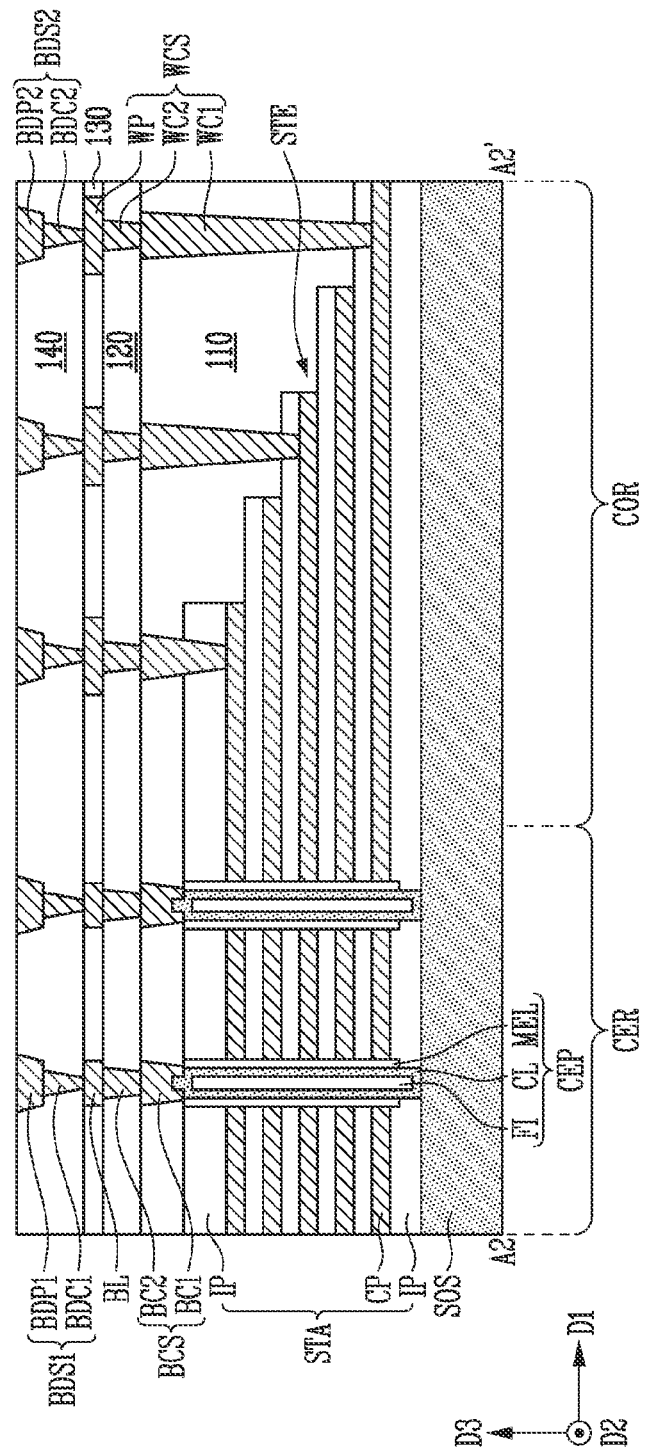

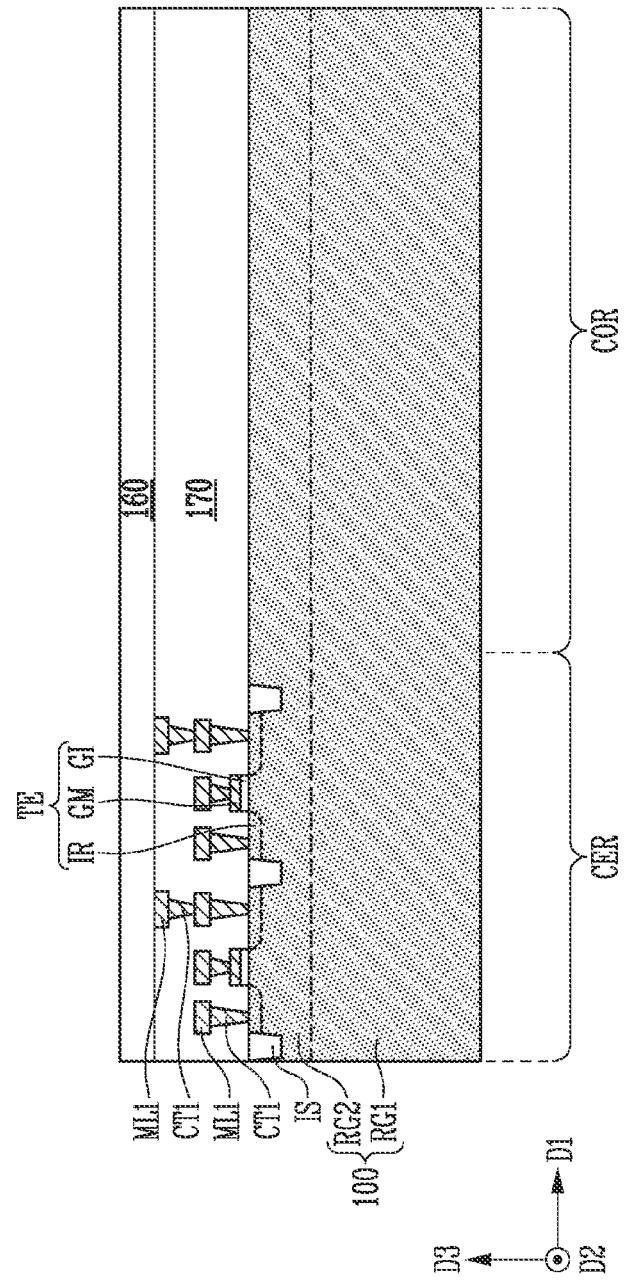

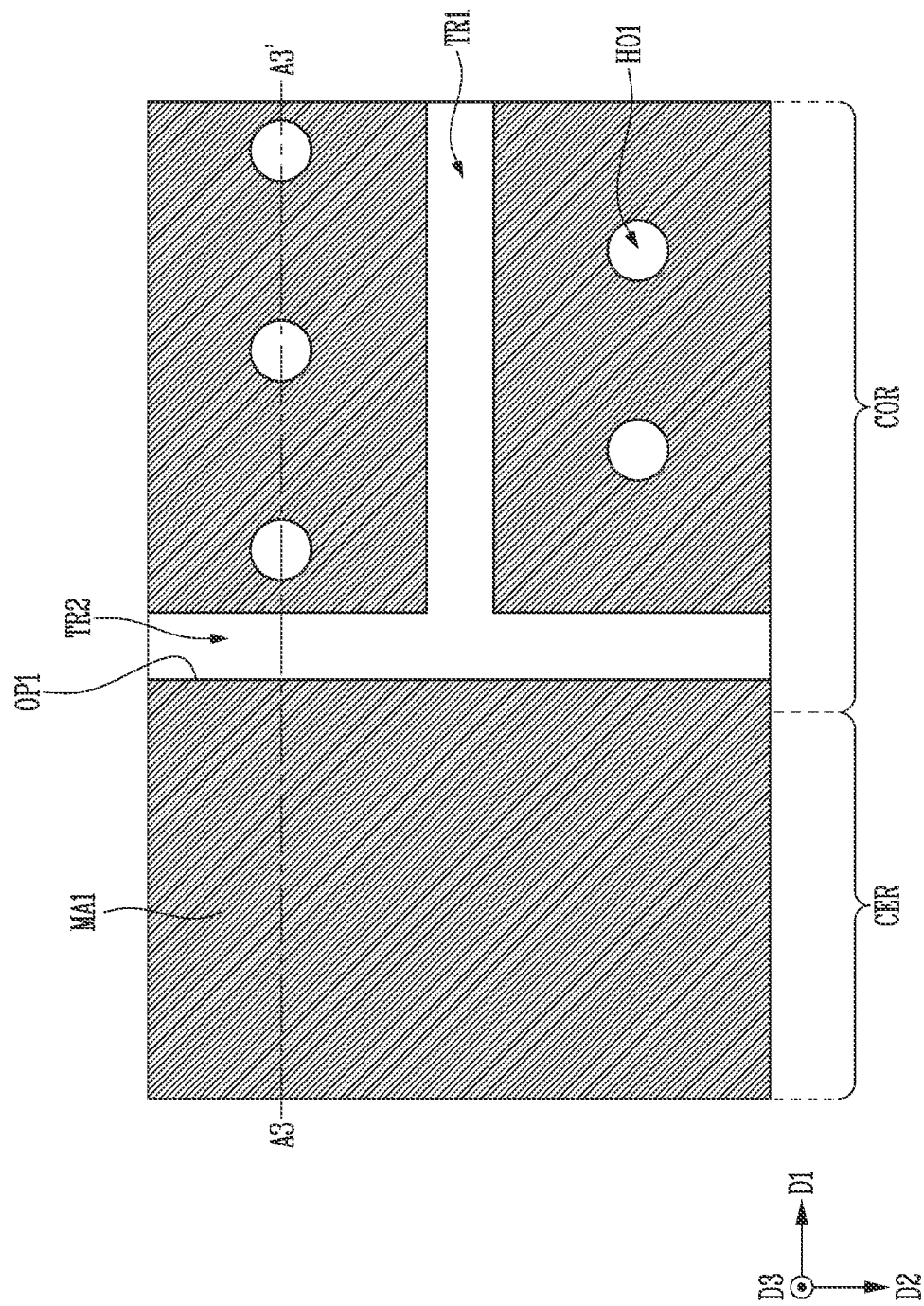

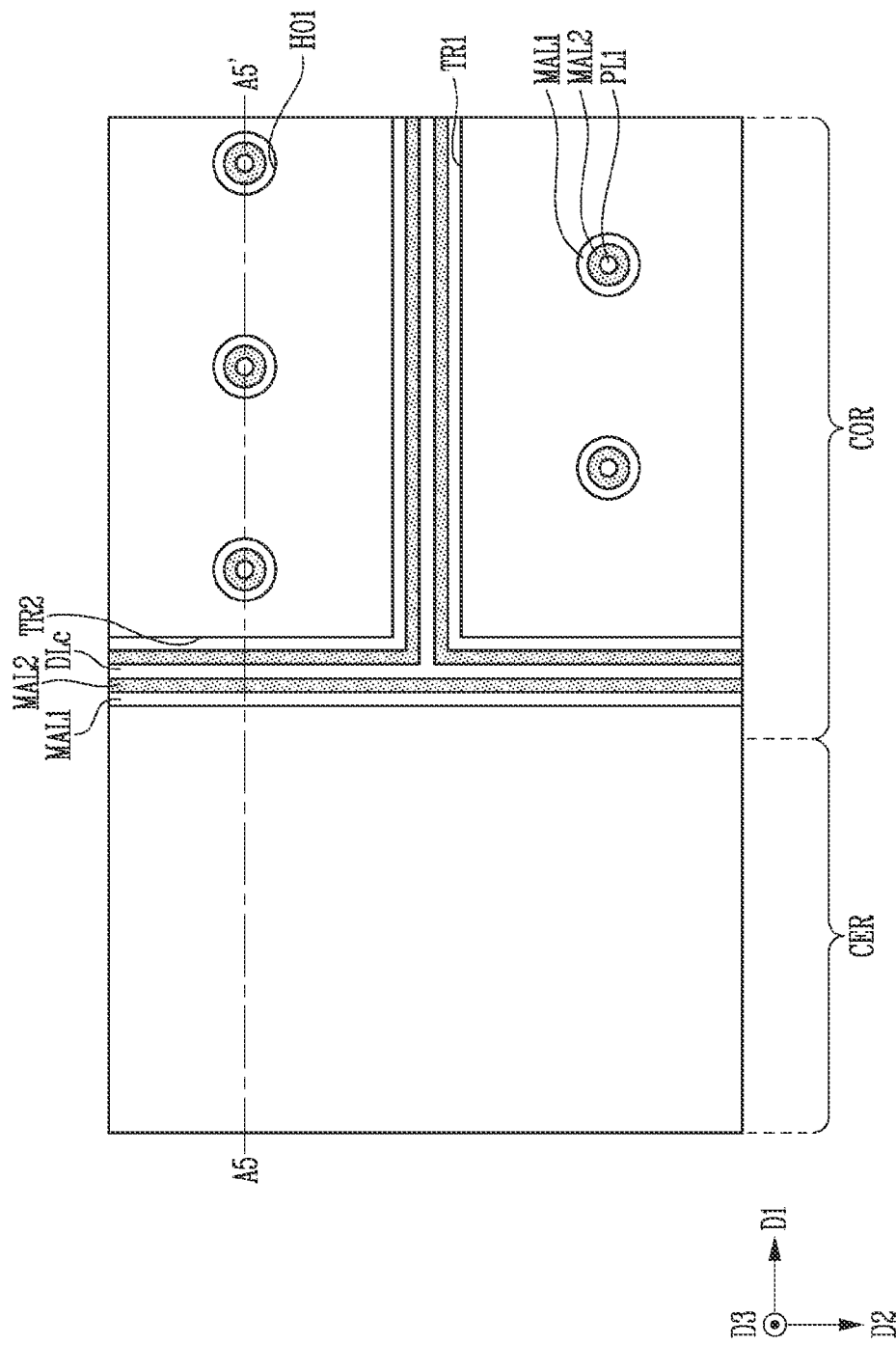

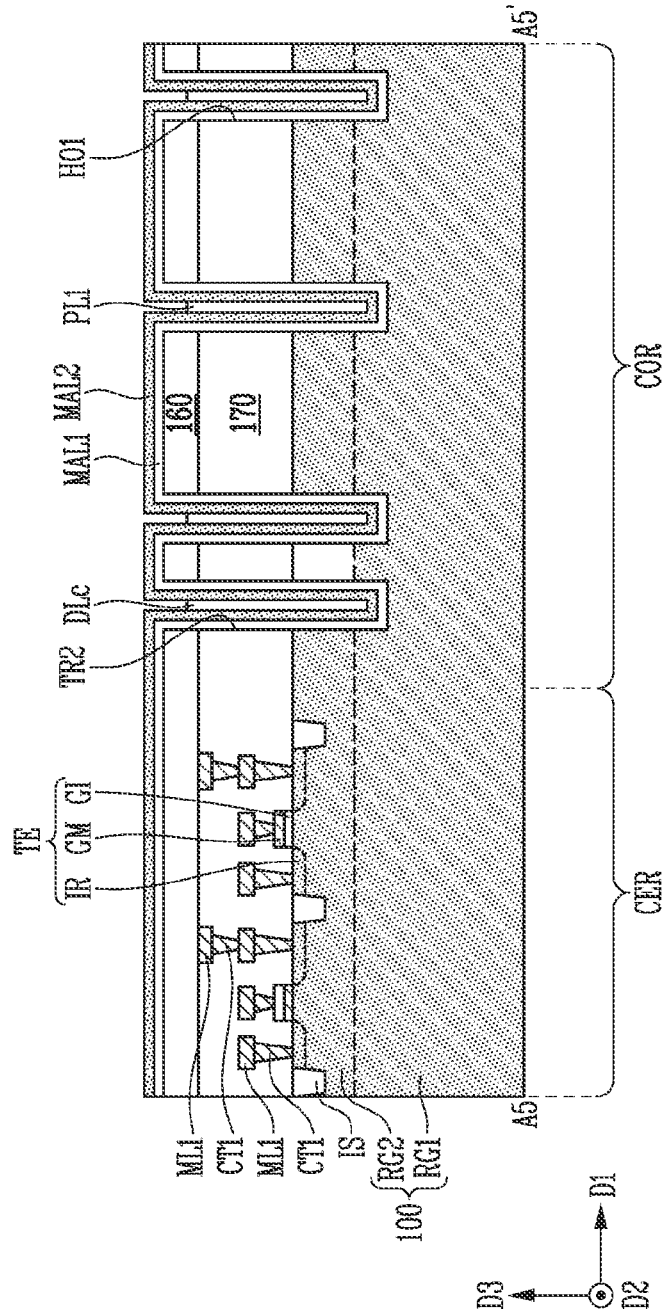

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0146321 filed on Nov. 4, 2020, in the Korean Intellectual Property Office, the entire disclosure of which is incorporated by reference herein.

BACKGROUND

1. Technical Field

Various embodiments of the invention relate generally to a semiconductor device and a method of manufacturing the semiconductor device, and more particularly, to a three-dimensional semiconductor device and a method of manufacturing the three-dimensional semiconductor device.

2. Related Art

Semiconductor memory devices may include memory cells that store data. As a three-dimensional semiconductor memory device includes three-dimensionally arranged memory cells, the number of memory cells per unit area of a substrate may be increased.

The number of memory cells stacked on top of each other may be increased so as to improve the integration density of a three-dimensional semiconductor memory device. As the number of stacked memory cells is increased, however, the operational reliability of the three-dimensional semiconductor memory device may be reduced.

SUMMARY

Various embodiments are directed to a semiconductor device having a reduced size and a method of manufacturing the semiconductor device.

According to an embodiment, a semiconductor device may include a stacked body including a conductive pattern and an insulating pattern, a cell plug passing through the stacked body, a semiconductor layer, a peripheral transistor arranged on the semiconductor layer, a first conductor coupling the peripheral transistor to the cell plug, a second conductor coupled to the conductive pattern, a pass plug coupled to the second conductor, and a pass gate surrounding the pass plug, wherein the pass gate is arranged at substantially a same level as the semiconductor layer.

According to an embodiment, a semiconductor device may include a stacked body including a conductive pattern and an insulating pattern, a cell plug passing through the stacked body, a semiconductor layer, a peripheral transistor arranged on the semiconductor layer, a first conductor coupling the peripheral transistor to the cell plug, a second conductor coupled to the conductive pattern, a pass plug coupled to the second conductor, and a pass gate surrounding the pass plug, wherein the pass gate includes a same material as the semiconductor layer.

According to an embodiment, a semiconductor device may include: a stacked body including alternately stacked conductive patterns and insulating patterns; a cell plug passing through the stacked body; pass plugs electrically coupled to the conductive patterns, respectively, the pass plugs including first pass plugs arranged in a first direction and second pass plugs arranged in the first direction; a first pass gate surrounding the first pass plugs, a second pass gate surrounding the second pass plugs, and a separating structure insulating the first pass gate from the second pass gate.

According to an embodiment, a method of manufacturing a semiconductor device may include forming a stacked body including a conductive pattern and an insulating pattern, forming a cell plug passing through the stacked body, forming a substrate including a first region and a second region on the first region, forming a pass plug surrounded by the substrate, electrically connecting the pass plug to the conductive pattern, removing the first region from the substrate to expose a portion of the pass plug, and forming a contact coupled to the portion of the pass plug.

BRIEF DESCRIPTION OF THE DRAWINGS

FIG. 1C is a plan diagram illustrating a semiconductor layer and pass gates of a semiconductor device according to an embodiment of the present disclosure;

FIGS. 2A, 3, 4A, 5A, 6A, 7, 8, 9, 10, 11, and 12 are diagrams illustrating a semiconductor device according to embodiments of the present disclosure;

FIG. 2B is a cross-sectional diagram taken along line A2-A2' of FIG. 2A;

FIG. 6B is a cross-sectional diagram taken along line A5-A5' of FIG. 6A;

DETAILED DESCRIPTION

Specific structural or functional descriptions of examples of embodiments in accordance with concepts which are disclosed in this specification are illustrated only to describe the examples of embodiments in accordance with the concepts, and the examples of embodiments in accordance with the concepts may be carried out by various forms, but the descriptions are not limited to the examples of embodiments described in this specification.

Figure 1A:
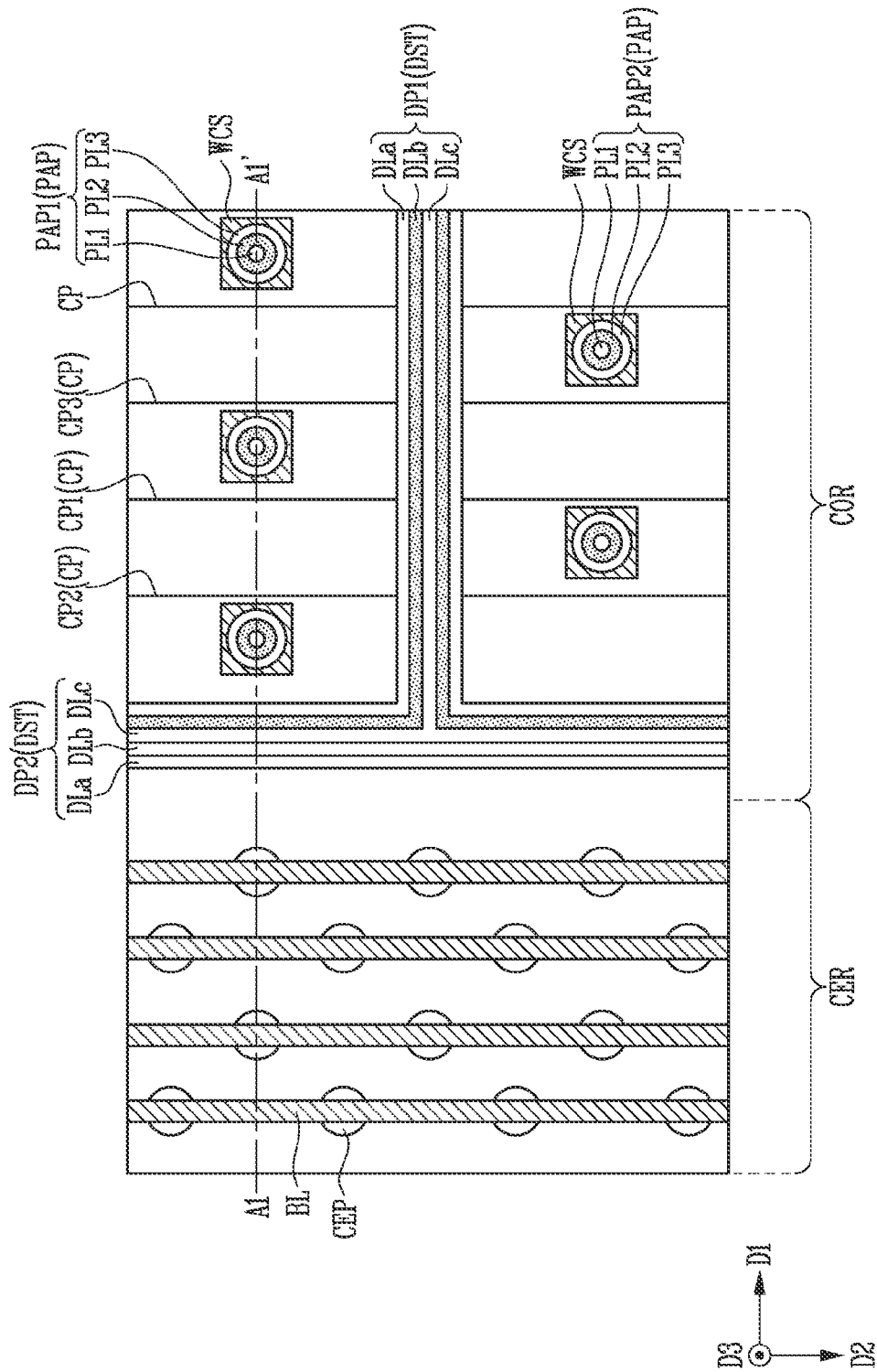
FIG. 1A is a plan diagram illustrating a semiconductor device according to an embodiment of the present disclosure.
Figure 1B:
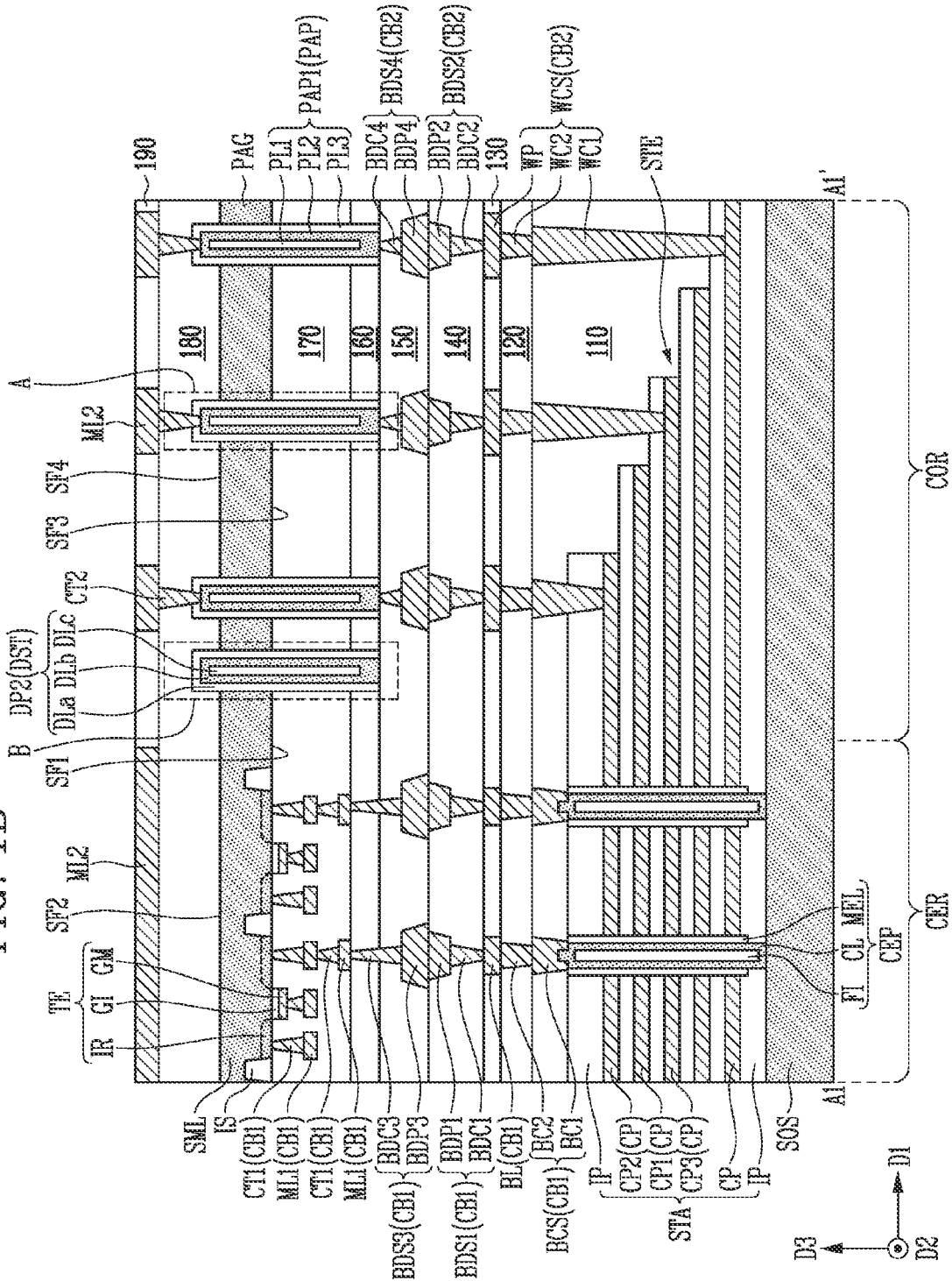
FIG. 1B is a cross-sectional diagram taken along line A1-A1' of FIG. 1A.
Figure 1D:
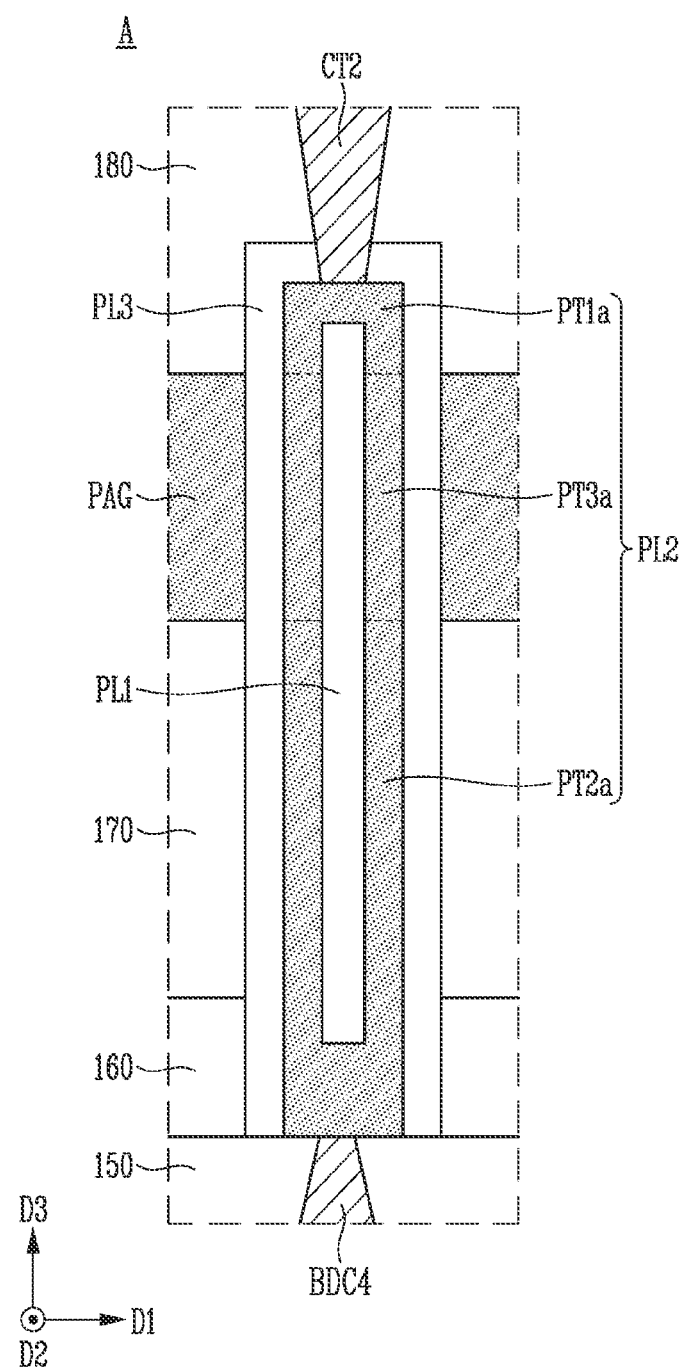
FIG. 1D is an enlarged diagram of an area A of FIG. 1B.
Figure 1E:
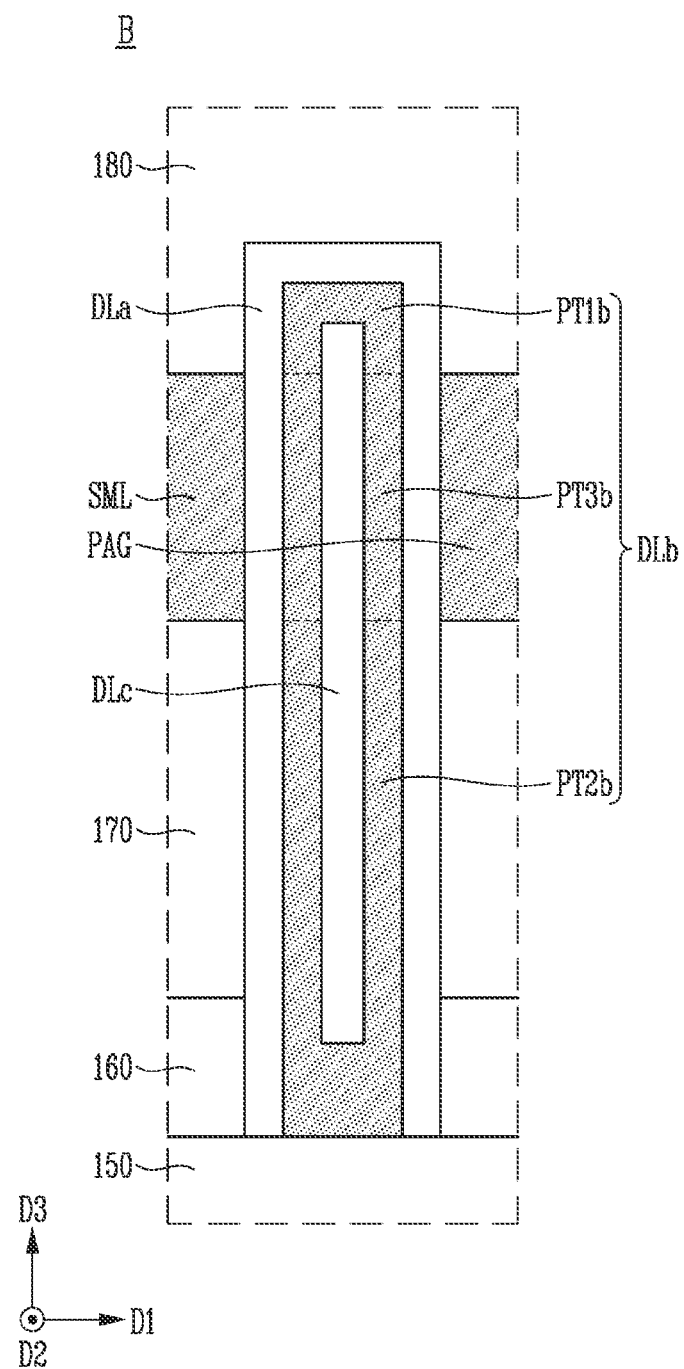
FIG. 1E is an enlarged diagram of an area B of FIG. 1B.

FIG. 1A is a plan diagram illustrating a semiconductor device according to an embodiment of the present disclosure. FIG. 1B is a cross-sectional diagram taken along line A1-A1' of FIG. 1A. FIG. 1C is a plan diagram illustrating a semiconductor layer and pass gates of a semiconductor device according to an embodiment of the present disclosure. FIG. 1D is an enlarged diagram of an area A of FIG. 1B. FIG. 1E is an enlarged diagram of an area B of FIG. 1B.

Referring to FIGS. 1A to 1C, a semiconductor device may include a cell region CER and a connection region COR. The cell region CER and the connection region COR may be differentiated from each other in a planar diagram as defined in a first direction D1 and a second direction D2. The first direction D1 and the second direction D2 may cross each other. For example, the first direction D1 and the second direction D2 may be orthogonal to each other.

The semiconductor device may include a source structure SOS. The source structure SOS may be in the form of a plate that extends along the plane defined in the first direction D1 and the second direction D2. The source structure SOS may include a conductive material. For example, the source structure SOS may include doped polysilicon.

According to an embodiment, the source structure SOS may be provided on a first substrate (not shown) that supports the source structure SOS. The first substrate may have a shape of a plate that extends along the plane defined in the first direction D1 and the second direction D2. For example, the first substrate may be a semiconductor substrate.

A stacked body STA may be provided on the source structure SOS. The stacked body STA may include conductive patterns CP and insulating patterns IP that are stacked alternately with each other in a third direction D3. The third direction D3 may cross the first direction D1 and the second direction D2. For example, the third direction D3 may be orthogonal to the first direction D1 and the second direction D2.

The conductive patterns CP may serve as word lines or select lines of the semiconductor device. The conductive patterns CP may include a conductive material. Insulating patterns IP may include an insulating material. For example, the insulating patterns IP may include an oxide.

The stacked body STA may include a stepped structure STE. The stepped structure STE may be defined by the conductive patterns CP and the insulating patterns IP of the stacked body STA. The conductive patterns CP and the insulating patterns IP of the stacked body STA may be formed in a stepwise manner to form the stepped structure STE. The stepped structure STE may be arranged in the connection region COR.

A first insulating layer 110 that covers the stacked body STA may be provided. The first insulating layer 110 may cover the stepped structure STE of the stacked body STA. The first insulating layer 110 may include an insulating material. For example, the first insulating layer 110 may include an oxide or a nitride.

Cell plugs CEP that pass through the stacked body STA may be formed. The cell plugs CEP may extend in the third direction D3. The cell plugs CEP may be provided in the cell region CER. Each of the cell plugs CEP may include a filling layer F1, a channel layer CL surrounding the filling layer F1, and a memory layer MEL surrounding the channel layer CL.

The filling layer F1 may extend in the third direction D3. The filling layer F1 may include an insulating material. For example, the filling layer F1 may include an oxide.

The channel layer CL may extend in the third direction D3. The channel layer CL may include a semiconductor material. For example, the channel layer CL may include polysilicon. The channel layer CL may be coupled to the source structure SOS. The channel layer CL may contact the source structure SOS. The channel layer CL may be electrically coupled to the source structure SOS.

The memory layer MEL may extend in the third direction D3. The memory layer MEL may include a tunnel insulating layer surrounding the channel layer CL, a data storage layer surrounding the tunnel insulating layer, and a blocking layer surrounding the data storage layer. The tunnel insulating layer may include a material that enables charge tunneling. For example, the tunnel insulating layer may include an oxide. According to an embodiment, the data storage layer may include a material in which charges are trapped. For example, the data storage layer may include a nitride. According to another embodiment, the data storage layer may include various kinds of materials according to a data storage method. For example, the data storage layer may include silicon, a phase change material, or nanodots. The blocking layer may include a material capable of blocking charge movements. For example, the blocking layer may include an oxide. The memory layer MEL may be spaced apart from the source structure SOS. A portion of the insulating pattern IP may be interposed between the memory layer MEL and the source structure SOS.

The second insulating layer 120 that covers the first insulating layer 110 may be provided. The second insulating layer 120 may include an insulating material. For example, the second insulating layer 120 may include an oxide or a nitride.

A third insulating layer 130 that covers the second insulating layer 120 may be provided. The third insulating layer 130 may include an insulating material. For example, the third insulating layer 130 may include an oxide or a nitride.

Bit line contact structures BCS that pass through the first and second insulating layers 110 and 120 may be formed. The bit line contact structures BCS may be provided in the cell region CER. The bit line contact structure BCS may be coupled to the cell plug CEP. The bit line contact structure BCS may be electrically coupled to the channel layer CL of the cell plug CEP. The bit line contact structure BCS may include a first bit line contact BC1 in the first insulating layer 110 and a second bit line contact BC2 in the second insulating layer 120. The first bit line contact BC1 may be coupled to the cell plug CEP and the second bit line contact BC2 may be coupled to the first bit line contact BC1. Each of the first bit line contact BC1 and the second bit line contact BC2 of the bit line contact structure BCS may include a conductive material.

Bit lines BL may be provided in the third insulating layer 130. The bit lines BL may be provided in the cell region CER. The bit lines BL may extend in the second direction D2. The bit lines BL may be spaced apart from each other in the first direction D1. The bit line BL may be electrically coupled to the cell plugs CEP through the bit line contact structures BCS. The bit line BL may be coupled to the second bit line contacts BC2 of the bit line contact structures BCS. The bit lines BL may include a conductive material.

Word line contact structures WCS that pass through the first, second, and third insulating layers 110, 120, and 130 may be formed. The word line contact structures WCS may be provided in the connection region COR. The word line contact structure WCS may be coupled to the conductive pattern CP. The word line contact structure WCS may be electrically coupled to the conductive pattern CP. The word line contact structure WCS may include a first word line contact WC1 penetrating the first insulating layer 110, a second word line contact WC2 in the second insulating layer 120, and a word line pad WP in the third insulating layer 130. The first word line contact WC1 may be coupled to the conductive pattern CP, the second word line contact WC2 may be coupled to the first word line contact WC1, and the word line pad WP may be coupled to the second word line contact WC2. The first word line contact WC1, the second word line contact WC2, and the word line pad WP of the word line contact structure WCS may include a conductive material.

A fourth insulating layer 140 that covers the third insulating layer 130 may be provided. The fourth insulating layer 140 may include an insulating material. For example, the fourth insulating layer 140 may include an oxide or a nitride.

A fifth insulating layer 150 that covers the fourth insulating layer 140 may be provided. The fifth insulating layer 150 may include an insulating material. For example, the fifth insulating layer 150 may include an oxide or a nitride.

A sixth insulating layer 160 that covers the fifth insulating layer 150 may be provided. The sixth insulating layer 160 may include an insulating material. For example, the sixth insulating layer 160 may include an oxide or a nitride.

First bonding structures BDS1 and second bonding structures BDS2 that pass through the fourth insulating layer 140 may be formed. The first bonding structures BDS1 may be provided in the cell region CER. The second bonding structures BDS2 may be provided in the connection region COR. The first bonding structure BDS1 may be coupled to the bit line BL. The first bonding structure BDS1 may be electrically coupled to the bit line BL. The first bonding structure BDS1 may include a first bonding contact BDC1, which is coupled to the bit line BL, and a first bonding pad BDP1, which is coupled to the first bonding contact BDC1. The first bonding pad BDP1 and the first bonding contact BDC1 of the first bonding structure BDS1 may include a conductive material. The width of the first bonding pad BDP1 may be reduced toward the stacked body STA and the cell plugs CEP, meaning that the first bonding pad BDP1 is tapered to have a decreasing width in the direction of the stacked body STA and the cell plugs CEP. For example, the width of the first bonding pad BDP1 in the first direction D1 may be reduced toward the stacked body STA and the cell plugs CEP.

The second bonding structure BDS2 may be coupled to the word line pad WP of the word line contact structure WCS. The second bonding structure BDS2 may be electrically connected to the word line pad WP of the word line contact structure WCS. The second bonding structure BDS2 may include a second bonding contact BDC2, which is coupled to the word line pad WP of the word line contact structure WCS, and a second bonding pad BDP2, which is coupled to the second bonding contact BDC2. The second bonding pad BDP2 and the second bonding contact BDC2 of the second bonding structure BDS2 may include a conductive material. The width of the second bonding pad BDP2 may be reduced toward the stacked body STA, meaning that the second bonding pad BDP2 is tapered to have a decreasing width in the direction of the stacked body STA. For example, the width of the second bonding pad BDP2 in the first direction D1 may be reduced toward the stacked body STA.

Third bonding structures BDS3 that pass through the fifth and sixth insulating layers 150 and 160 may be formed. The third bonding structures BDS3 may be provided in the cell region CER. The third bonding structure BDS3 may include a third bonding pad BDP3 and a third bonding contact BDC3. The third bonding pad BDP3 of the third bonding structure BDS3 may be coupled to the first bonding pad BDP1 of the first bonding structure BDS1. The third bonding pad BDP3 of the third bonding structure BDS3 may be electrically coupled to the first bonding pad BDP1 of the first bonding structure BDS1. The third bonding pad BDP3 of the third bonding structure BDS3 may be coupled to the first bonding pad BDP1 of the first bonding structure BDS1. The third bonding contact BDC3 of the third bonding structure BDS3 may be coupled to the third bonding pad BDP3. The third bonding contact BDC3 of the third bonding structure BDS3 may include a conductive material.

The width of the third bonding pad BDP3 may increase toward the stacked body STA and the cell plugs CEP. For example, the width of the third bonding pad BDP3 in the first direction D1 may increase toward the stacked body STA and the cell plugs CEP.

Fourth bonding structures BDS4 that pass through the fifth insulating layer 150 may be formed. The fourth bonding structures BDS4 may be provided in the connection region COR. The fourth bonding structure BDS4 may include a fourth bonding pad BDP4 and a fourth bonding contact BDC4. The fourth bonding pad BDP4 of the fourth bonding structure BDS4 may be coupled to the second bonding pad BDP2 of the second bonding structure BDS2. The fourth bonding pad BDP4 of the fourth bonding structure BDS4 may be electrically coupled to the second bonding pad BDP2 of the second bonding structure BDS2. The fourth bonding pad BDP4 of the fourth bonding structure BDS4 may be coupled to the second bonding pad BDP2 of the second bonding structure BDS2. The fourth bonding contact BDC4 may be coupled to the fourth bonding pad BDP4. The fourth bonding pad BDP4 and the fourth bonding contact BDC4 of the fourth bonding structure BDS4 may include a conductive material.

The width of the fourth bonding pad BDP4 may increase toward the stacked body STA. For example, the width of the fourth bonding pad BDP4 in the first direction D1 may increase toward the stacked body STA.

A seventh insulating layer 170 that covers the sixth insulating layer 160 may be provided. The seventh insulating layer 170 may include an insulating material. For example, the seventh insulating layer 170 may include an oxide or a nitride.

A semiconductor layer SML that covers a portion of the seventh insulating layer 170 may be provided. The semiconductor layer SML may be provided in the cell region CER. The semiconductor layer SML may include a semiconductor material. For example, the semiconductor layer SML may include doped polysilicon. For example, the semiconductor layer SML may be doped with P type impurities.

Pass gates PAG that cover another portion of the seventh insulating layer 170 may be provided. The pass gates PAG may be provided in the connection region COR. The pass gates PAG may include the same material as the semiconductor layer SML. The pass gates PAG may include a semiconductor material. For example, the pass gates PAG may include doped polysilicon. For example, impurities with which the pass gates PAG are doped may be P type impurities.

The pass gates PAG may be located at the same level as the semiconductor layer SML. For example, the pass gates PAG and the semiconductor layer SML may be located on an upper surface of the seventh insulating layer 170. The semiconductor layer SML may include a first surface SF1 that faces the stacked body STA and a second surface SF2 that is opposite to the first surface SF1. The pass gate PAG may include a third surface SF3 that faces the stacked body STA and a fourth surface SF4 that is opposite to the third surface SF3. The first surface SF1 of the semiconductor layer SML may be a lower surface of the semiconductor layer SML. The second surface SF2 of the semiconductor layer SML may be an upper surface of the semiconductor layer SML. The third surface SF3 of the pass gate PAG may be a lower surface of the pass gate PAG. The fourth surface SF4 of the pass gate PAG may be an upper surface of the pass gate PAG. The first surface SF1 of the semiconductor layer SML may have substantially the same level as the third surface SF3 of the pass gate PAG. The second surface SF2 of the semiconductor layer SML may have substantially the same level as the fourth surface SF4 of the pass gate PAG.

First contacts CT1 and first metal lines ML1 may be provided in the seventh insulating layer 170. The first contacts CT1 and the first metal lines ML1 may be provided in the cell region CER. The first contact CT1 and the first metal line ML1 may be coupled to each other. The first metal line ML1 may be coupled to the third bonding contact BDC3 of the third bonding structure BDS3. The first contacts CT1 and the first metal lines ML1 may include a conductive material.

Peripheral transistors TE may be provided between the semiconductor layer SML and the seventh insulating layer 170. The peripheral transistors TE may be provided in the cell region CER. The peripheral transistors TE may be disposed on the first surface SF1 of the semiconductor layer SML. The peripheral transistors TE may constitute a peripheral circuit of the semiconductor device. For example, the peripheral transistors TE may constitute a page buffer of the semiconductor device.

Each of the peripheral transistors TE may include impurity regions IR, a gate insulating layer GI, and a gate electrode GM. The impurity regions IR may be formed by doping the semiconductor layer SML with impurities such that a conductivity type or a doping concentration of the impurity region IR may be different from that of the semiconductor layer SML.

The impurity region IR may be coupled to the first contact CT1. The impurity region IR may contact the first contact CT1. The gate insulating layer GI may include an insulating material. For example, the gate insulating layer GI may include an oxide. The gate electrode GM may be coupled to the first contact CT1. The gate electrode GM may contact the first contact CT1. The gate electrode GM may include a conductive material.

Isolation layers IS may be provided in the semiconductor layer SML. The isolation layers IS may electrically insulate the peripheral transistors TE from each other. The isolation layers IS may include an insulating material. For example, the isolation layers IS may include an oxide.

Each of the first contact CT1, the first metal line ML1, the third bonding structure BDS3, the first bonding structure BDS1, the bit line BL, and the bit line contact structure BCS may be defined as a first conductor CB1. The peripheral transistor TE may be coupled to the cell plug CEP through the first conductors CB1. In other words, the peripheral transistor TE may be coupled to the cell plug CEP through the first contact CT1, the first metal line ML1, the third bonding structure BDS3, the first bonding structure BDS1, the bit line BL, and the bit line contact structure BCS. The peripheral transistor TE may be coupled to the cell plug CEP through the first conductors CB1.

A separating structure DST that passes through the sixth insulating layer 160 and the seventh insulating layer 170 may be provided. The separating structure DST may be provided in the connection region COR. The separating structure DST may include a first separator DP1 that extends in the first direction D1 and a second separator DP2 that extends in the second direction D2. The first separator DP1 and the second separator DP2 may be coupled to each other. The second separator DP2 may be coupled to one end portion of the first separator DP1. In a planar diagram according to FIGS. 1A and 1C, the separating structure DST may have a T shape.

The semiconductor layer SML and the pass gates PAG may be separated from each other by the second separator DP2 of the separating structure DST. The semiconductor layer SML and the pass gates PAG may be spaced apart from each other by the second separator DP2 of the separating structure DST. The second separator DP2 of the separating structure DST may be disposed between the semiconductor layer SML and the pass gates PAG. The semiconductor layer SML and the pass gates PAG may be spaced apart from each other in the first direction D1 with the second separator DP2 of the separating structure DST interposed therebetween.

The pass gates PAG may be separated from each other by the first separator DP1 of the separating structure DST. The pass gates PAG decoupled by the first separator DP1 may be defined as a first pass gate PAG1 and a second pass gate PAG2. The first and second pass gates PAG1 and PAG2 may be decoupled from each other by the first separator DP1 of the separating structure DST. The first separator DP1 of the separating structure DST may be disposed between the first and second pass gates PAG1 and PAG2. The first and second pass gates PAG1 and PAG2 may be decoupled from each other in the second direction D2 with the first separator DP1 of the separating structure DST interposed therebetween.

Each of the first separator DP1 and the second separator DP2 may include a first separating layer DLa, a second separating layer DLb, and a third separating layer DLc. The first separating layer DLa, the second separating layer DLb, and the third separating layer DLc of the first separator DP1 may extend in the first direction D1. The first separating layer DLa, the second separating layer DLb, and the third separating layer DLc of the second separator DP2 may extend in the second direction D2. The first separating layer DLa of the first separator DP1 may be coupled to the first separating layer DLa of the second separator DP2. The second separating layer DLb of the first separator DP1 may be coupled to the second separating layer DLb of the second separator DP2. The third separating layer DLc of the first separator DP1 may be coupled to the third separating layer DLc of the second separator DP2.

The second separating layer DLb may be provided in the first separating layer DLa. Side walls and an upper surface of the second separating layer DLb may be covered by the first separating layer DLa. The third separating layer DLc may be provided in the second separating layer DLb. Side walls and an upper surface of the third separating layer DLc may be covered by the second separating layer DLb.

The first separating layer DLa may include an insulating material. For example, the first separating layer DLa may include an oxide. The second separating layer DLb may include a semiconductor material. For example, the second separating layer DLb may include polysilicon. The third separating layer DLc may include an insulating material. For example, the third separating layer DLc may include an oxide.

Pass plugs PAP that pass through the sixth and seventh insulating layers 160 and 170 may be provided. The pass plugs PAP may be provided in the connection region COR. The pass plugs PAP may extend in the third direction D3. The pass plugs PAP may have a columnar shape.

Each of the pass plugs PAP may include a first pass layer PL1, a second pass layer PL2 surrounding the first pass layer PL1, and a third pass layer PL3 surrounding the second pass layer PL2. The first pass layer PL1 may be provided in the second pass layer PL2. The second pass layer PL2 may be provided in the third pass layer PL3. The second pass layer PL2 may cover sidewalls and an upper surface of the first pass layer PL1. The third pass layer PL3 may cover sidewalls and an upper surface of the second pass layer PL2.

The first pass layer PL1 may include an insulating material. For example, the first pass layer PL1 may include an oxide. The second pass layer PL2 may include a semiconductor material. For example, the second pass layer PL2 may include polysilicon. The third pass layer PL3 may include an insulating material. For example, the third pass layer PL3 may include an oxide.

The second pass layer PL2 may be spaced apart from the pass gate PAG by the third pass layer PL3. The structure which includes the pass gate PAG, the second pass layer PL2, and the third pass layer PL3 may be used as a pass transistor of the semiconductor device.

The fourth bonding structure BDS4, the second bonding structure BDS2, and the word line contact structure WCS may be respectively defined as second conductors CB2. The pass plug PAP may be coupled to the conductive pattern CP through the second conductors CB2. In other words, the pass plug PAP may be coupled to the conductive pattern CP through the fourth bonding structure BDS4, the second bonding structure BDS2, and the word line contact structure WCS. The pass plug PAP may be electrically coupled to the conductive pattern CP through the second conductors CB2.

The pass plugs PAP may include first pass plugs PAP1 that pass through the first pass gate PAG1 and second pass plugs PAP2 that pass through the second pass gate PAG2. The first pass gate PAG1 may surround the first pass plugs PAP1. The second pass gate PAG2 may surround the second pass plugs PAP2. The first pass plugs PAP1 may be arranged in the first direction D1. The second pass plugs PAP2 may be arranged in the first direction D1. The first pass plugs PAP1 may be spaced apart from the second pass plugs PAP2 with the first separator DP1 of the separating structure DST interposed therebetween. For example, the first pass plugs PAP1 may be spaced apart from the second pass plugs PAP2 with the first separator DP1 of the separating structure DST interposed therebetween.

The first pass plugs PAP1 which are adjacent to each other may be spaced apart from each other in the first direction D1. The second pass plugs PAP2 which are adjacent to each other may be spaced apart from each other in the first direction D1. The distance at which the first pass plugs PAP1 are spaced apart from the semiconductor layer SML in the first direction D1 may be different from the distance at which the second pass plugs PAP2 are spaced apart from the semiconductor layer SML in the first direction D1. For example, referring to FIG. 1C, the first pass plugs PAP1 may be spaced apart from the semiconductor layer SML in the first direction D1 at a first distance L1, a second distance L2, and a third distance L3. In addition, the second pass plugs PAP2 may be spaced apart from the semiconductor layer SML in the first direction D1 at a fourth distance L4 and a fifth distance L5. The first distance L1 may be smaller than the fourth distance L4. The fourth distance L4 may be smaller than the second distance L2. The fifth distance L5 may be smaller than the third distance L3.

The conductive patterns CP may include a first conductive pattern CP1, a second conductive pattern CP2 adjacent to the first conductive pattern CP1, and a third conductive pattern CP3 adjacent to the first conductive pattern CP1. The second and third conductive patterns CP2 and CP3 may be arranged under and above the first conductive pattern CP1. The first, second, and third conductive patterns CP1, CP2, and CP3 may be the conductive patterns CP adjacent to each other.

The first pass plugs PAP1 and the second pass plugs PAP2 may be electrically coupled to the conductive patterns CP. For example, when the second pass plug PAP2 is electrically coupled to the first conductive pattern CP1, the first pass plug PAP1 may be electrically coupled to the second conductive pattern CP2 adjacent to the first conductive pattern CP1, and the first pass plugs PAP1 may be electrically coupled to the third conductive pattern CP3 adjacent to the first conductive pattern CP1.

The word line contact structures WCS coupled to the first pass plugs PAP1 and the word line contact structures WCS coupled to the second pass plugs PAP2 may be alternately coupled to the conductive patterns CP. For example, when the word line contact structure WCS coupled to the second pass plug PAP2 is coupled to the first conductive pattern CP1, the word line contact structure WCS coupled to the first pass plug PAP1 may be coupled to the second conductive pattern CP2 adjacent to the first conductive pattern CP1, and the word line contact structure WCS coupled to the first pass plug PAP1 may be coupled to the third conductive pattern CP3 adjacent to the first conductive pattern CP1.

An eighth insulating layer 180 may be provided to cover the semiconductor layer SML, the pass gates PAG, the separating structure DST, and the pass plugs PAP. The eighth insulating layer 180 may include an insulating material. For example, the eighth insulating layer 180 may include an oxide or a nitride.

A ninth insulating layer 190 that covers the eighth insulating layer 180 may be provided. The ninth insulating layer 190 may include an insulating material. For example, the ninth insulating layer 190 may include an oxide or a nitride.

Second contacts CT2 may be provided in the eighth insulating layer 180. The second contact CT2 may be coupled to the pass plug PAP. The second contact CT2 may pass through the third pass layer PL3 and coupled to the second pass layer PL2. The second contact CT2 may pass through the third pass layer PL3 to contact the second pass layer PL2. The second contact CT2 may include a conductive material.

Second metal lines ML2 may be provided in the ninth insulating layer 190. The second metal line ML2 may be coupled to the second contact CT2. The second metal lines ML2 may include a conductive material.

Referring to FIG. 1D, the second pass layer PL2 of each of the pass plugs PAP may include a first portion PT1*a* that contacts the second contact CT2, a second portion PT2*a* that contacts the fourth bonding contact BDC4, and a third portion PT3*a* between the first and second portions PT1*a* and PT2*a*.

The first portion PT1*a* of the second pass layer PL2 may be surrounded by the eighth insulating layer 180. The first portion PT1*a* of the second pass layer PL2 may be arranged at the same level as the eighth insulating layer 180. The second portion PT2*a* of the second pass layer PL2 may be surrounded by the sixth and seventh insulating layers 160 and 170. The third portion PT3*a* of the second pass layer PL2 may be surrounded by the pass gate PAG. The third portion PT3*a* of the second pass layer PL2 may be arranged at the same level as the pass gate PAG. The third portion PT3*a* of the second pass layer PL2 may be adjacent to the pass gate PAG.

The first portion PT1*a* of the second pass layer PL2 may be located above the third portion PT3*a* of the second pass layer PL2. The second portion PT2*a* of the second pass layer PL2 may be located under the third portion PT3*a* of the second pass layer PL2. The third portion PT3*a* of the second pass layer PL2 may couple the first portion PT1*a* and the second portion PT2*a* of the second pass layer PL2 to each other. The second portion PT2a of the second pass layer PL2 may cover a lower surface of the first pass layer PL.

The first portion PT1a of the second pass layer PL2 may include doped polysilicon. For example, the first portion PT1a of the second pass layer PL2 may be doped with N type impurities. For example, the N type impurities with which the first portion PT1a of the second pass layer PL2 is doped may be phosphorus. The second portion PT2a of the second pass layer PL2 may include doped polysilicon. For example, the second portion PT2a of the second pass layer PL2 may be doped with N type impurities. For example, the N type impurities with which the second portion PT2a of the second pass layer PL2 is doped may be phosphorus. The third portion PT3a of the second pass layer PL2 may include undoped polysilicon.

Referring to FIG. 1E, the second separating layer DLb of each of the first separator DP1 and the second separator DP2 may include a first portion PT1b, a second portion PT2b, and a third portion PT3b.

The first portion PT1b of the second separating layer DLb may be surrounded by the eighth insulating layer 180. The first portion PT1b of the second separating layer DLb may be arranged at the same level as the eighth insulating layer 180. The second portion PT2b of the second separating layer DLb may be surrounded by the sixth and seventh insulating layers 160 and 170. The third portion PT3b of the second pass layer PL2 may be arranged at the same level as the pass gate PAG and the semiconductor layer SML.

The first portion PT1b of the second separating layer DLb may be disposed above the third portion PT3b of the second separating layer DLb. The second portion PT2b of the second separating layer DLb may be disposed under the third portion PT3b of the second separating layer DLb. The third portion PT3b of the second separating layer DLb may couple the first portion PT1b and the second portion PT2b of the second separating layer DLb. The second portion PT2b of the second separating layer DLb may cover a lower surface of the third separating layer DLc.

The first portion PT1b of the second separating layer DLb may include doped polysilicon. For example, the first portion PT1b of the second separating layer DLb may be doped with N type impurities. The N type impurities with which the first portion PT1b of the second separating layer DLb is doped may be, for example, phosphorus. The second portion PT2b of the second separating layer DLb may include doped polysilicon. For example, the second portion PT2b of the second separating layer DLb may be doped with N type impurities. The N type impurities with which the second portion PT2b of the second separating layer DLb is doped may be, for example, phosphorus. The third portion PT3b of the second separating layer DLb may include undoped polysilicon.

In the semiconductor device according to an embodiment, the semiconductor layer SML on which the peripheral transistor TE is formed may be disposed at the same level as the pass gate PAG of the pass transistor. Therefore, it may be unnecessary to form a separate conductive layer that is used as a gate of the pass transistor. Accordingly, the size of the semiconductor device may be reduced.

In the semiconductor device according to embodiments of the present disclosure, pass transistors may be arranged to overlap with the stepped structure STE of the stacked body STA. Accordingly, an increase in area of the semiconductor device caused by the pass transistors may be reduced. In addition, the length of the second conductors CB2 coupling the pass transistor and the conductive pattern CP may be reduced.

FIGS. 2A, 3, 4A, 5A, 6A, 7, 8, 9, 10, 11, and 12 are diagrams illustrating a semiconductor device according to embodiments of the present disclosure. FIG. 2B is a cross-sectional diagram taken along line A2-A2' of FIG. 2A. FIG. 4B is a cross-sectional diagram taken along line A3-A3' of FIG. 4A. FIG. 5B is a cross-sectional diagram taken along line A4-A4' of FIG. 5A. FIG. 6B is a cross-sectional diagram taken along line A5-A5' of FIG. 6A.

For the sake of brevity, any repetitive description of components having already been described above with reference to FIGS. 1A to 1E will be omitted. A manufacturing method to be described below merely corresponds to one of the embodiments of manufacturing a semiconductor device. Thus, a method of manufacturing a semiconductor device as shown in FIGS. 1A to 1E may not be limited to the manufacturing method below.

Referring to FIGS. 2A and 2B, the source structure SOS may be formed. The stacked body STA may be provided on the source structure SOS. The cell plugs CEP that pass through the stacked body STA may be formed. The first insulating layer 110 that covers the stacked body STA may be provided. The first bit line contacts BC1 and the first word line contacts WC1 that pass through the fourth insulating layer 110 may be formed.

The second, third, and fourth insulating layers 120, 130, and 140 that cover the first insulating layer 110 may be formed in a sequential manner. When the second, third, and fourth insulating layers 120, 130, and 140 are formed, the second bit line contacts BC2, the bit line BL, and the first bonding structure BDS1 may be formed in a sequential manner. When the second, third, and fourth insulating layers 120, 130, and 140 are formed, the second bit line contacts WC2, the word line pads WP, and the second bonding structure BDS2 may be formed in a sequential manner.

Referring to FIG. 3, a second substrate 100 may be formed. The second substrate 100 may include a first region RG1 and a second region RG2. The second region RG2 may be provided in the first region RG1. The second region RG2 may be arranged at a higher level than the first region RG1.

The first region RG1 and the second region RG2 of the second substrate 100 may include a semiconductor material. The first region RG1 of the second substrate 100 may be doped with impurities at a first doping concentration. The second region RG2 of the second substrate 100 may be doped with impurities at a second doping concentration. For example, the first region RG1 and the second region RG2 may be doped with P type impurities. The first doping concentration may be greater than the second doping concentration.

The peripheral transistors TE may be formed on the second region RG2 of the second substrate 100. The isolation layers IS may be formed in the second region RG2 of the second substrate 100. The seventh insulating layer 170 and the sixth insulating layer 160 that cover the second substrate 100 and the peripheral transistors TE may be formed in a sequential manner. When the sixth and seventh insulating layers 160 and 170 are formed, the first contacts CT1 and the first metal lines ML1 may be formed in the seventh insulating layer 170.

Figure 4B:
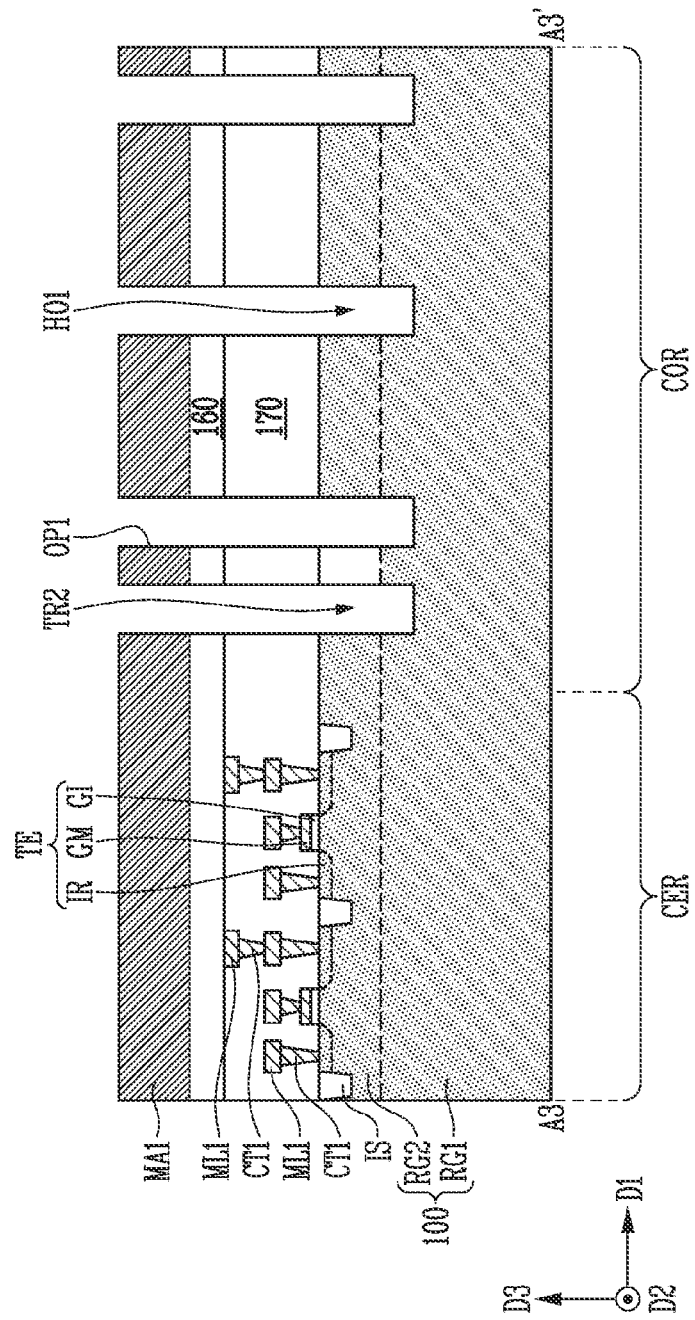
FIG. 4B is a cross-sectional diagram taken along line A3-A3' of FIG. 4A.

Referring to FIGS. 4A and 4B, a first mask layer MA1 may be formed on the sixth insulating layer 160. The first mask layer MA1 may include first openings OP1.

The sixth insulating layer 160, the seventh insulating layer 170, and the second substrate 100 may be etched using the first mask layer MA1 as an etch mask. A first trench TR1, a second trench TR2, and first holes HO1 may be formed by etching the sixth insulating layer 160, the seventh insulating layer 170, and the second substrate 100. The first trench TR1, the second trench TR2, and the first holes HO1 may pass through the sixth insulating layer 160 and the seventh insulating layer 170. The first trench TR1, the second trench TR2, and the first holes HO1 may pass through the second region RG2 of the second substrate 100. Lower surfaces of the first trench TR1, the second trench TR2, and the first holes HO1 may be disposed in the first region RG1 of the second substrate 100. After the sixth insulating layer 160, the seventh insulating layer 170, and the second substrate 100 are etched, the first mask layer MA1 may be removed.

The first trench TR1 may extend in the first direction D1. The second trench TR2 may extend in the second direction D2. The first trench TR1 and the second trench TR2 may be coupled to each other. The second trench TR2 may be coupled to one end portion of the first trench TR1. The first trench TR1 may be arranged between the first holes HO1. The first trench TR1, the second trench TR2, and the first holes HO1 may be formed in the connection region COR.

Figure 5A:
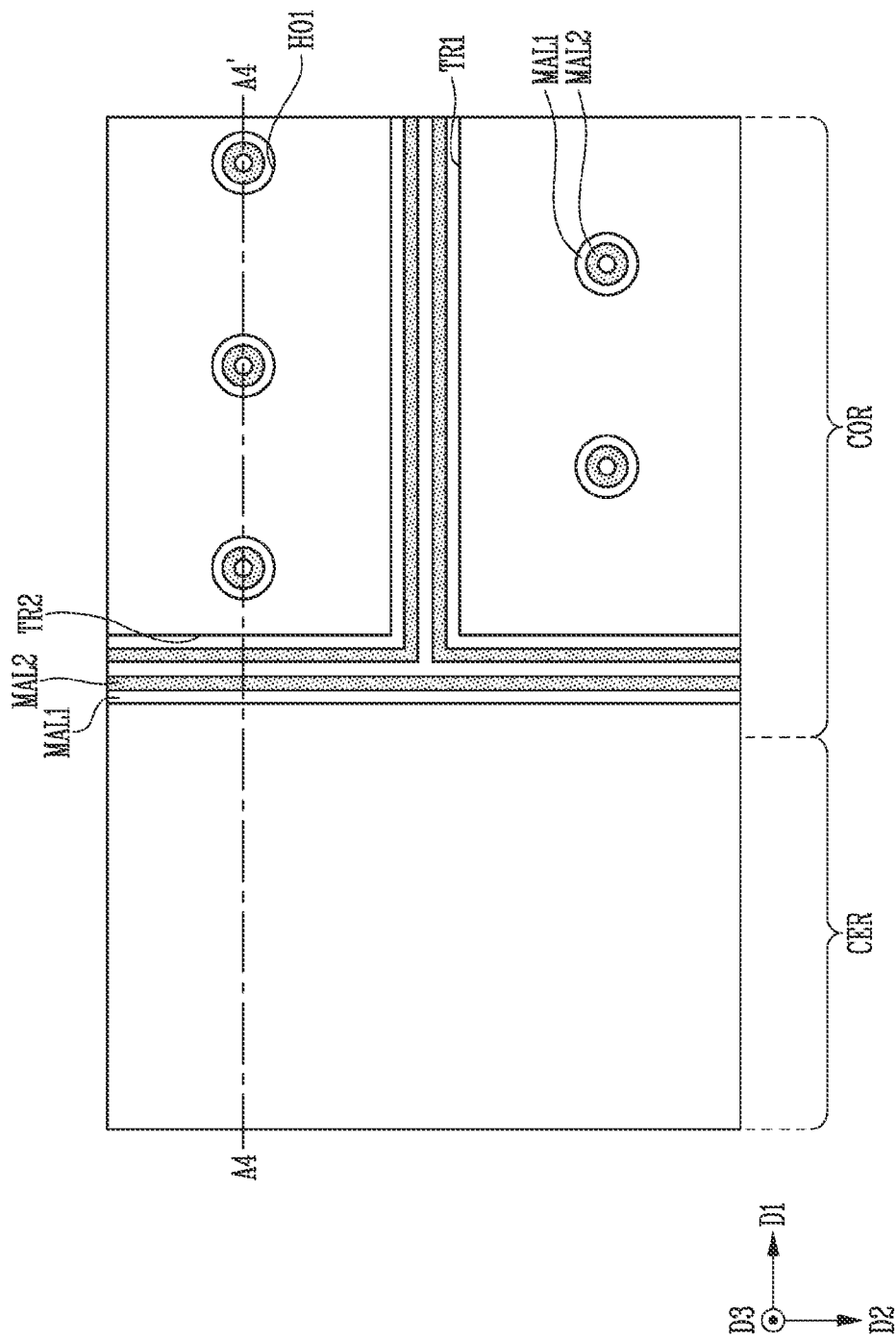
Figure 5B:
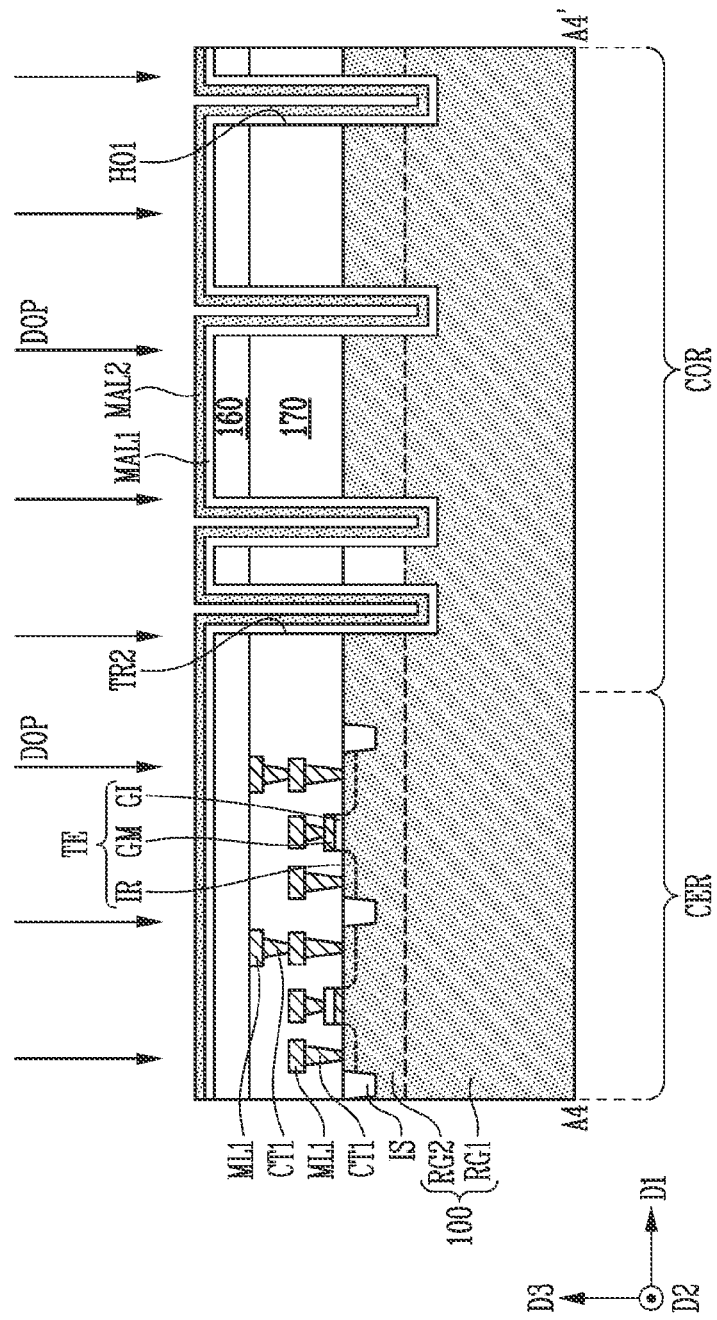
FIG. 5B is a cross-sectional diagram taken along line A4-A4' of FIG. 5A.

Referring to FIGS. 5A and 5B, a first material layer MAL1 and a second material layer MAL2 may be formed. The first material layer MAL1 may be conformally formed on an upper surface of the sixth insulating layer 160, the first trench TR1, the second trench TR2, and the first holes HO1. Conformally forming a layer on a surface means that the layer conforms to or follows a shape of the surface. A portion of the first material layer MAL1 may be formed in the first trench TR1. A portion of the first material layer MAL1 may be formed in the second trench TR2. A portion of the first material layer MAL1 may be formed in the first hole HO1. The first material layer MAL1 may include an insulating material. For example, the first material layer MAL1 may include an oxide.

The second material layer MAL2 may be conformally provided on the first material layer MALL. A portion of the second material layer MAL2 may be formed in the first trench TR1. A portion of the second material layer MAL2 may be formed in the second trench TR2. A portion of the second material layer MAL2 may be formed in the first hole HO1. The second material layer MAL2 may include a semiconductor material. For example, the second material layer MAL2 may include polysilicon.

The second material layer MAL2 may be doped with impurities DOP. The impurities DOP may be injected into the second material layer MAL2 in a direction opposite to the third direction D3. The impurities DOP may be injected into the second material layer MAL2 in a direction orthogonal to an upper surface of the second substrate 100. The second material layer MAL2 may be doped as the impurities DOP are injected and diffused.

In a direction in which the impurities DOP are injected into the second material layer MAL2, a portion of the second material layer MAL2 which is surrounded by the first region RG1 may be doped with the impurities DOP, a portion of the second material layer MAL2 which is surrounded by the second region RG2 might not be doped with the impurities DOP, and a portion of the second material layer MAL2 which is surrounded by the sixth and seventh insulating layers 160 and 170 may be doped with the impurities DOP.

Referring to FIGS. 6A and 6B, the third separating layers DLc and the first pass layers PL1 may be formed on the second material layer MAL2. Forming the third separating layers DLc and the first pass layers PL1 may include forming an insulating material layer on the second material layer MAL2 and separating the third separating layer DLc and the first pass layers PL1 from each other by etching the insulating material layer. The third separating layer DLc may be formed in the first trench TR1 or the second trench TR2. The third separating layer DLc in the first trench TR1 and the third separating layer DLc in the second trench TR2 may be coupled to each other without a boundary therebetween. In other words, the third separating layer DLc in the first trench TR1 and the third separating layer DLc in the second trench TR2 may be formed integrally with each other. The first pass layer PL1 may be formed in the first hole HO1.

Figure 7:
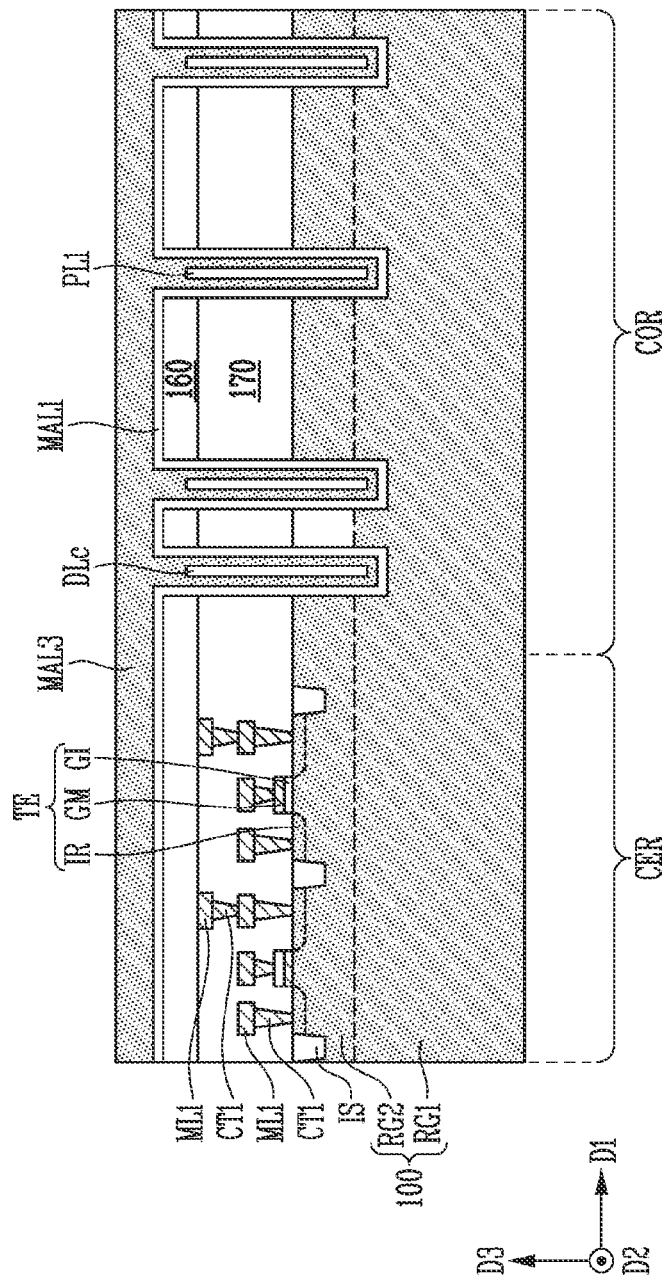

Referring to FIG. 7, a third material layer MAL3 may be formed. Forming the third material layer MAL3 may include depositing a semiconductor material onto the second material layer MAL2, the third separating layers DLc, and the first pass layers PL1. For example, the semiconductor material may be polysilicon. The semiconductor material deposited onto the second material layer MAL2 may be coupled to the second material layer MAL2 without a boundary. In other words, the semiconductor material deposited onto the second material layer MAL2 may be coupled integrally with the second material layer MAL2. The second material layer MAL2 and the semiconductor material that are coupled integrally with each other may be defined as the third material layer MAL3.

Figure 8:
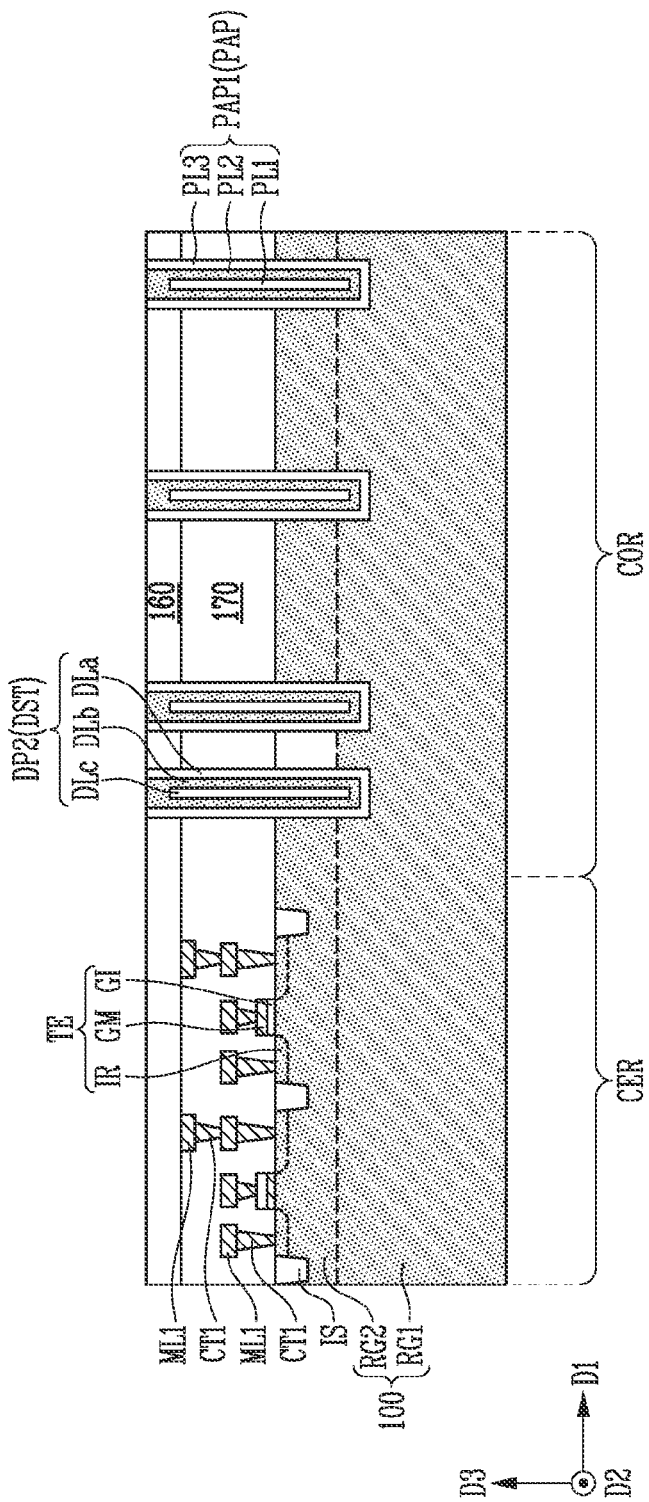

Referring to FIG. 8, an upper portion of the third material layer MAL3 and an upper portion of the first material layer MAL1 may be removed. For example, the upper portion of the third material layer MAL3 and the upper portion of the first material layer MAL1 may be removed by chemical mechanical polishing (CMP). As the upper portion of the first material layer MAL1 is removed, the first material layer MAL1 may be separated into a plurality of portions. The separated portions of the first material layer MAL1 may be defined as the first separating layers DLa or the third pass layers PL3. As the upper portion of the third material layer MAL3 is removed, the third material layer MAL3 may be separated into a plurality of portions. The separated portions of the third material layer MAL3 may be defined as the second separating layers DLb or the second pass layers PL2.

Because the upper portion of the third material layer MAL3 and the upper portion of the first material layer MAL1 are removed, the pass plugs PAP may be formed. The pass plugs PAP may be surrounded by the second substrate 100. The pass plugs PAP may pass through the second region RG2 of the second substrate 100. Because the upper portion of the third material layer MAL3 and the upper portion of the first material layer MAL1 are removed, the separating structure DST may be formed. The separating structure DST may pass through the second region RG2 of the second substrate 100.

As the upper portion of the third material layer MAL3 and the upper portion of the first material layer MAL1 are removed, the upper surface of the sixth insulating layer 160 may be exposed.

Figure 9:
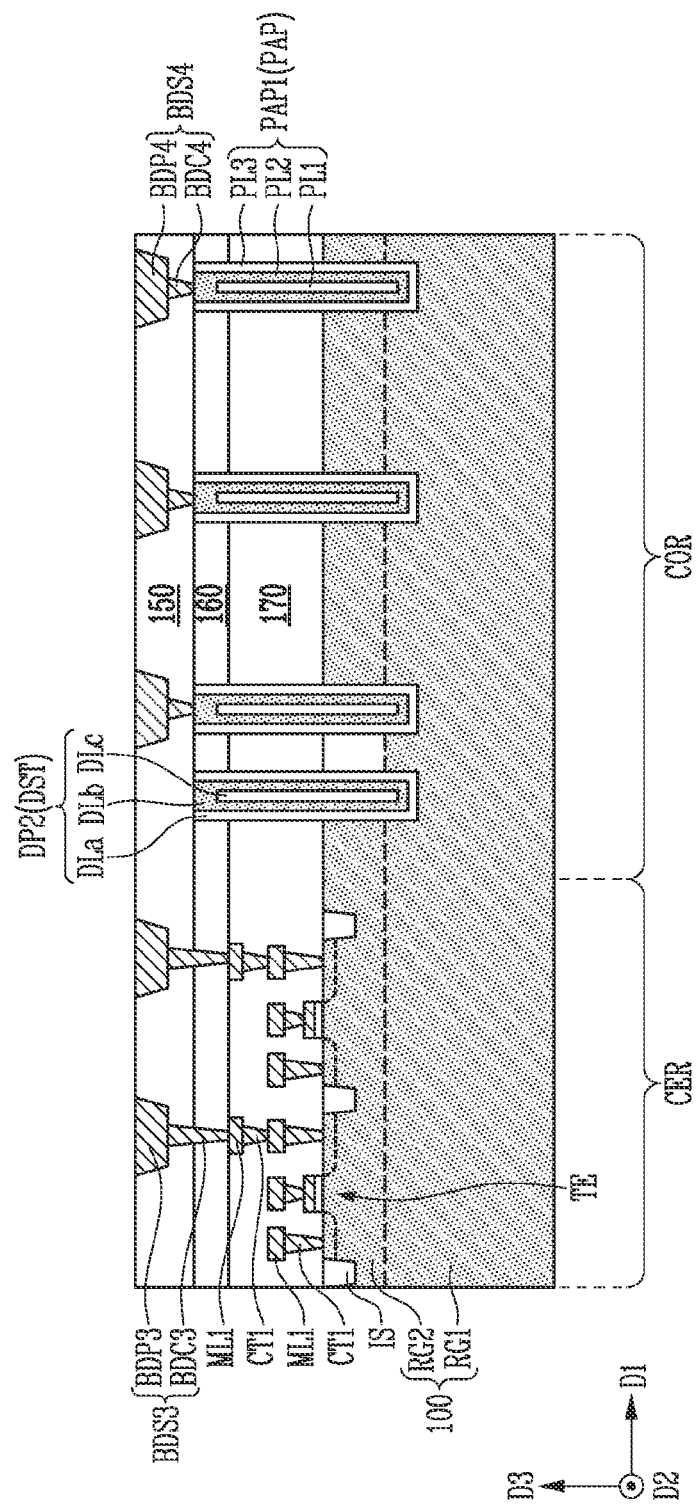

Referring to FIG. 9, the fifth insulating layer 150 may be formed on the sixth insulating layer 160. The third bonding structure BDS3 that is coupled to the first metal line ML1 may be formed. The fourth bonding structure BDS4 that is coupled to the pass plug PAP may be formed.

Figure 10:
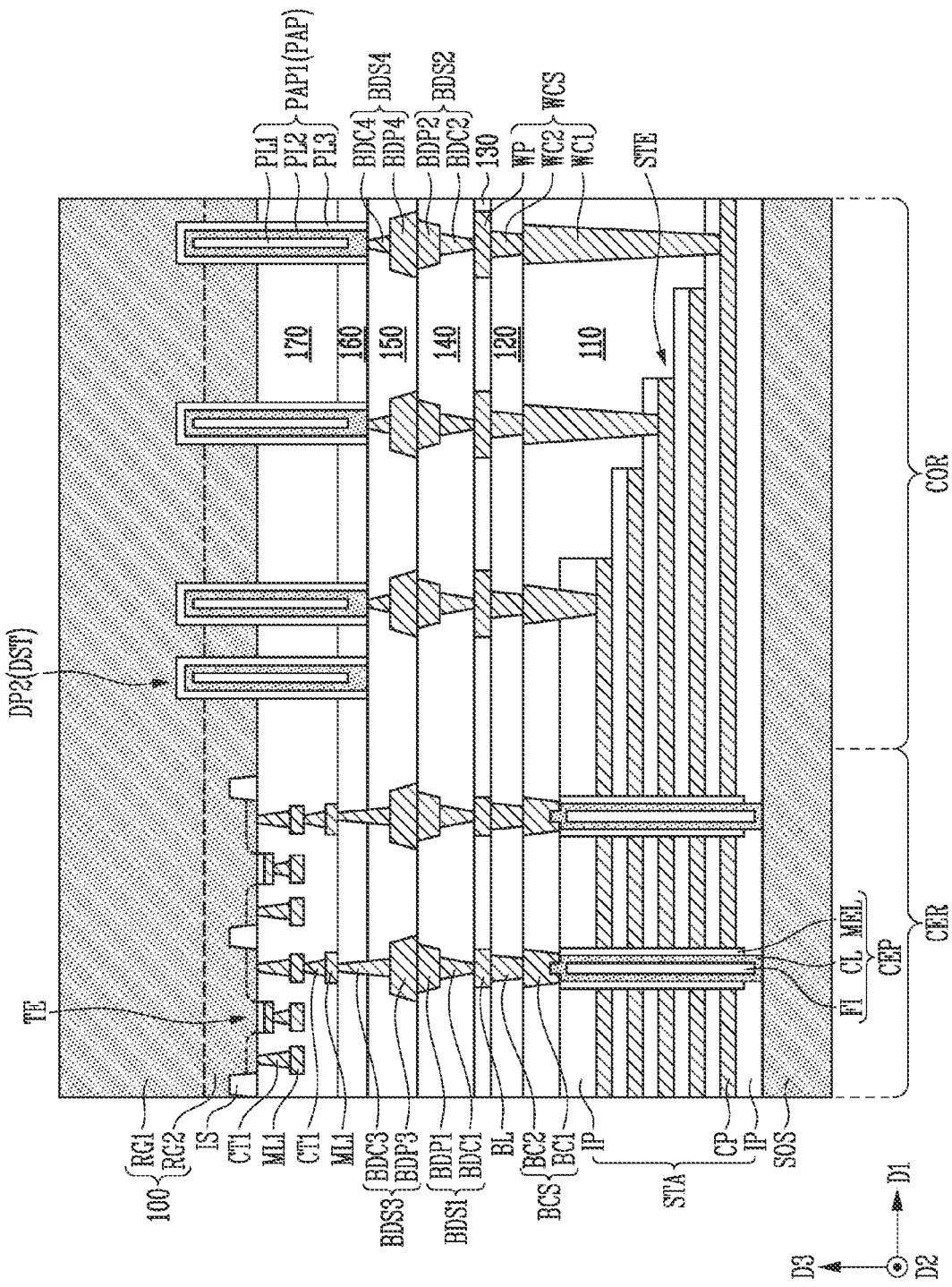

Referring to FIG. 10, the second substrate 100 may be reversed. As the second substrate 100 is reversed, the components formed on the second substrate 100 may be reversed accordingly. Subsequently, a third bonding pad BP3 of the third bonding structure BDS3 may be bonded to a first bonding pad BP1 of the first bonding structure BDS1, and a fourth bonding pad BP4 of the fourth bonding structure BDS4 may be bonded to a second bonding pad BP2 of the second bonding structure BDS2.

The third bonding pad BP3 of the third bonding structure BDS3 may be bonded to the first bonding pad BP1 of the first bonding structure BDS1. The peripheral transistor TE may be electrically coupled to the cell plug CEP. The fourth bonding pad BP4 of the fourth bonding structure BDS4 may be bonded to the second bonding pad BP2 of the second bonding structure BDS2, and the pass plug PAP may be electrically coupled to the conductive pattern CP. The peripheral transistor TE may be electrically connected to the cell plug CEP when the pass plug PAP is electrically connected to the conductive pattern CP.

The fifth insulating layer 150 may be bonded to the fourth insulating layer 140 at the same time as the first, second, third, and fourth bonding pads BP1, BP2, BP3, and BP4 are bonded.

Figure 11:
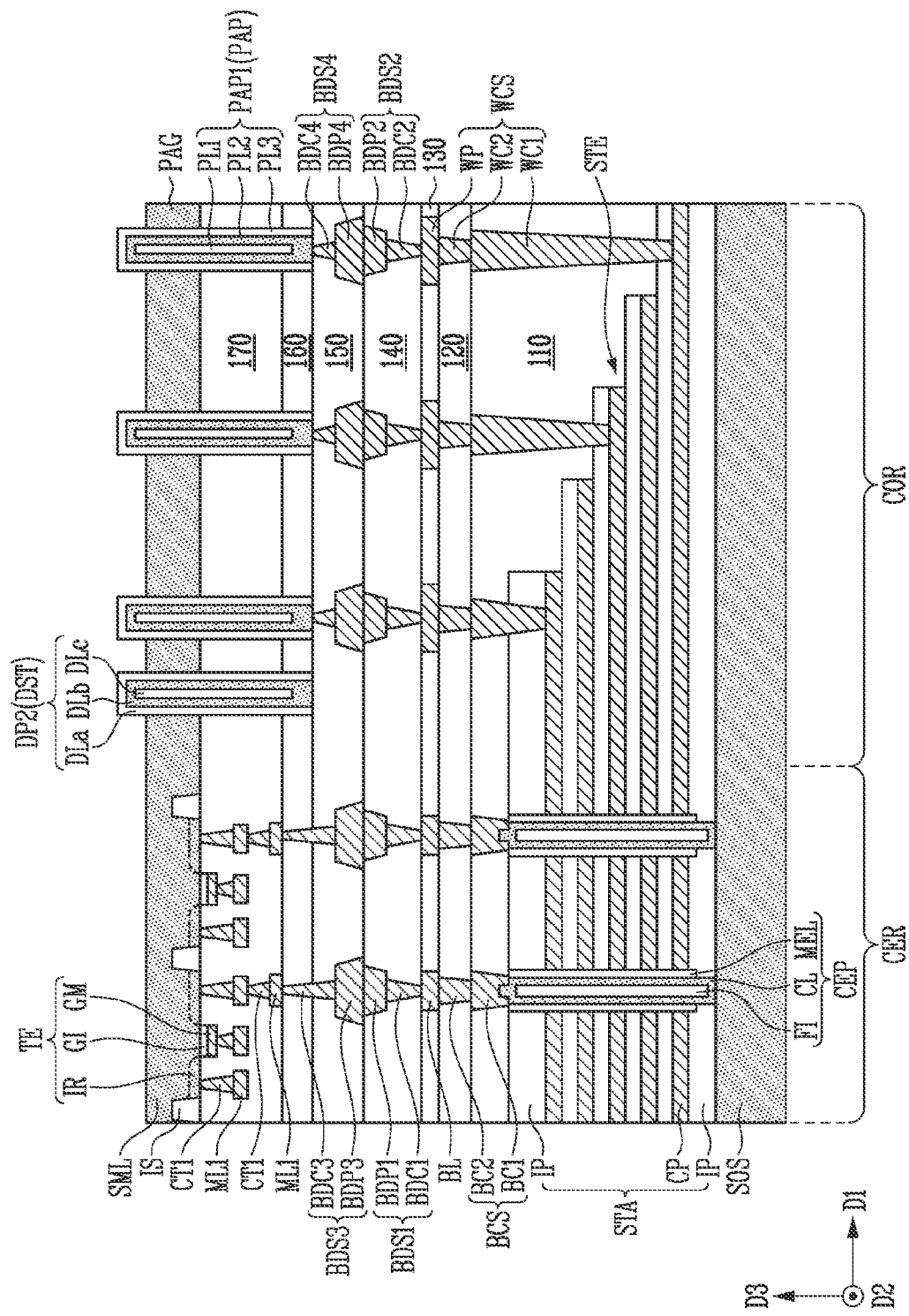

Referring to FIG. 11, the first region RG1 of the second substrate 100 may be selectively removed. For example, the first region RG1 of the second substrate 100 may be selectively removed by a dip out process.

The first region RG1 of the second substrate 100 may be removed and separated into the plurality of second region RG2 portions. The plurality of separated portions of the second region RG2 may be defined as the semiconductor layer SML or the pass gates PAG.

The first region RG1 of the second substrate 100 may be removed, to partially expose the pass plugs PAP and the separating structure DST. For example, upper portions of the pass plugs PAP and an upper portion of the separating structure DST which are not buried in the second region RG2 may be exposed.

Figure 12:
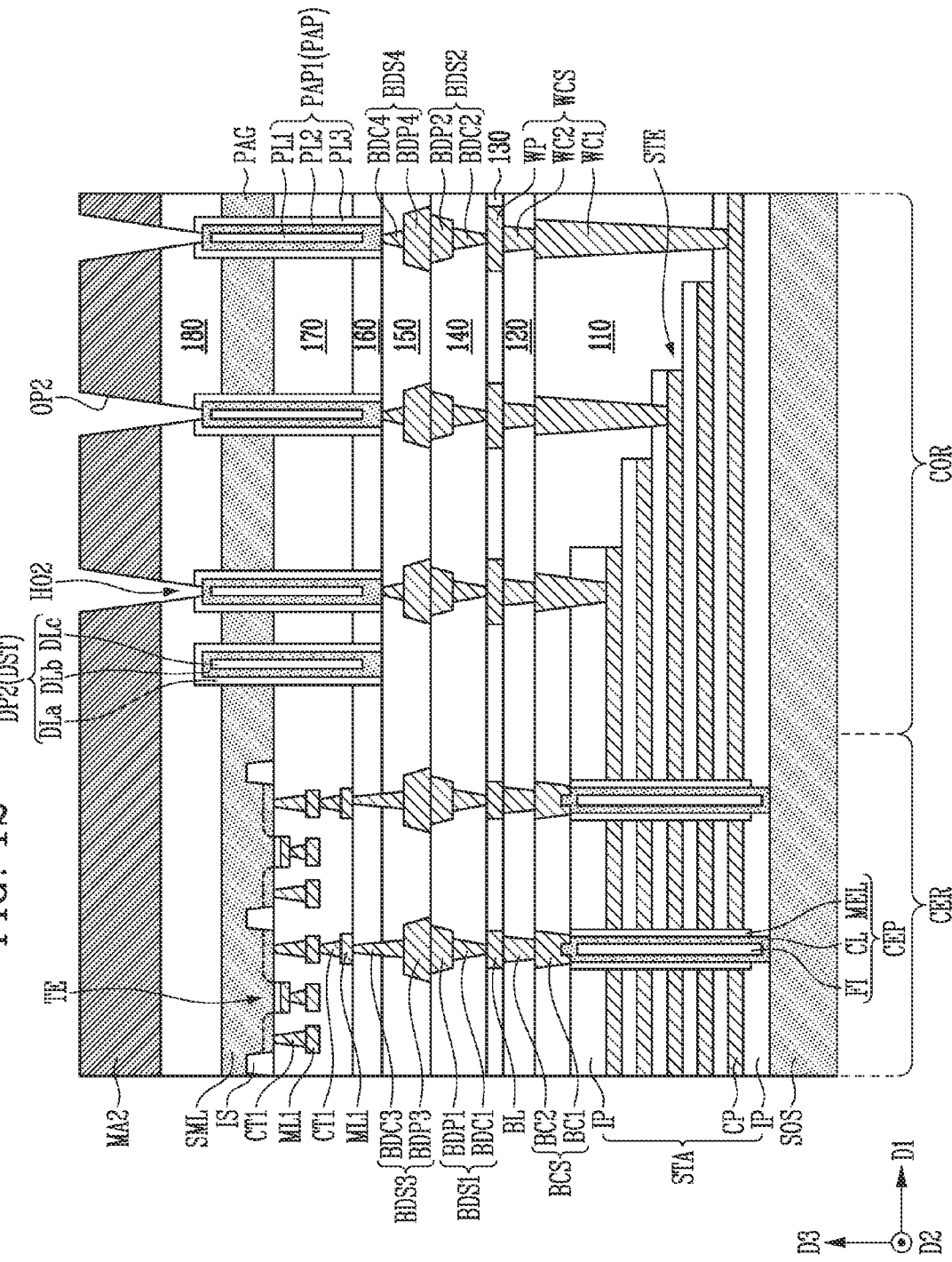

Referring to FIG. 12, the eighth insulating layer 180 that covers the semiconductor layer SML, the pass gates PAG, the separating structure DST, and the pass plugs PAP may be formed.

A second mask layer MA2 that includes second openings OP2 may be formed on the eighth insulating layer 180. Subsequently, an etch process may be performed using the second mask layer MA2 as an etch mask. By the etch process, the eighth insulating layer 180 and the third pass layer PL of the pass plug PAP may be etched.

The eighth insulating layer 180 and the third pass layer PL3 of the pass plug PAP may be etched to form a second hole HO2. The second pass layer PL2 of the pass plug PAP may be exposed through the second hole HO2. After the eighth insulating layer 180 and the third pass layer PL3 of the pass plug PAP are etched, the second mask layer MA2 may be removed.

Subsequently, the second contacts CT2 may be formed in the second hole HO2, the ninth insulating layer 190 may be formed on the eighth insulating layer 180, and the second metal lines ML2 may be formed in the ninth insulating layer 190, referring to FIG. 1B. The second contact CT2 may be coupled to a portion of the pass plug PAP which is exposed due to the removal of the first region RG1 of the second substrate 100.

The method of manufacturing the semiconductor device according to an embodiment may include forming the semiconductor layer SML and the pass gate PAG by separating the second substrate 100. Accordingly, the size of the semiconductor device may be reduced because it may be unnecessary to form a separate conductive layer to be used as the gate of the pass transistor.

The method of manufacturing the semiconductor device according to an embodiment may set the width and depth of the pass plug PAP to target values by adjusting the width and the depth of the first hole HO1. The pass transistor may be optimized according to the target values of the width and the depth of the pass plug PAP.

Figure 13:
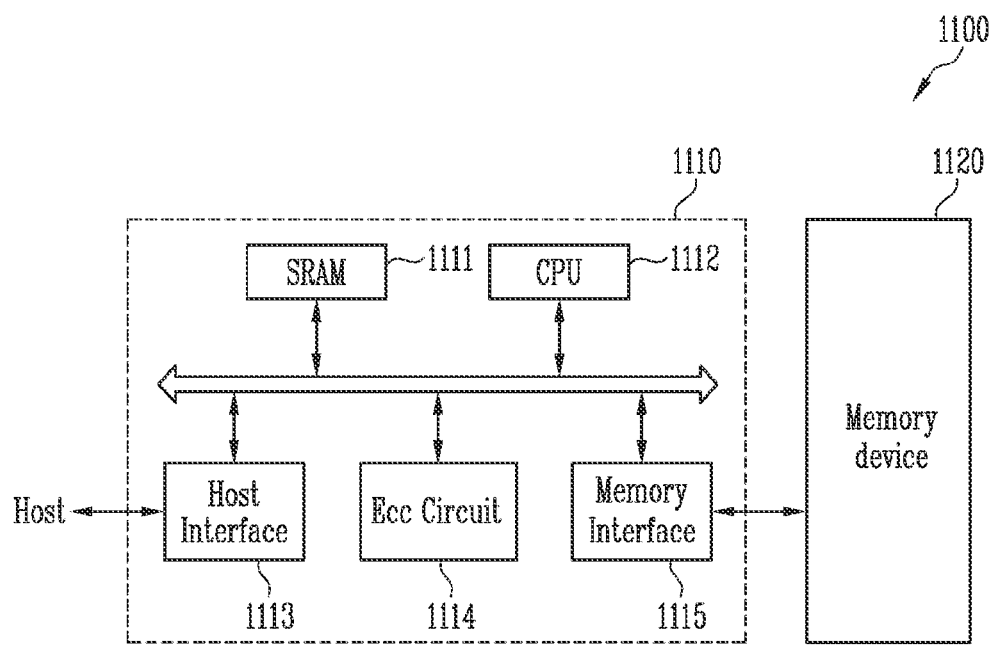
FIG. 13 is a block diagram illustrating the configuration of a memory system according to an embodiment of the present disclosure.

FIG. 13 is a block diagram illustrating the configuration of a memory system 1100 according to an embodiment of the present disclosure.

Referring to FIG. 13, the memory system 1100 may include a memory device 1120 and a memory controller 1110.

The memory device 1120 may include a semiconductor device according to embodiments of the present disclosure. The memory device 1120 may be a multi-chip package composed of a plurality of flash memory chips.

The memory controller 1110 may be configured to control the memory device 1120 and include static random access memory (SRAM) 1111, a CPU 1112, a host interface 1113, an error correction code (ECC) circuit 1114, and a memory interface 1115. The SRAM 1111 may serve as operation memory of the CPU 1112, the CPU 1112 may perform a control operation for data exchange of the memory controller 1110, and the host interface 1113 may include a data exchange protocol of a host accessing the memory system 1100. In addition, the ECC circuit 1114 may detect and correct errors included in the data read from the memory device 1120, and the memory interface 1115 may perform interfacing with the memory device 1120. The memory controller 1110 may further include read-only memory (ROM) that stores code data to interface with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

Figure 14:
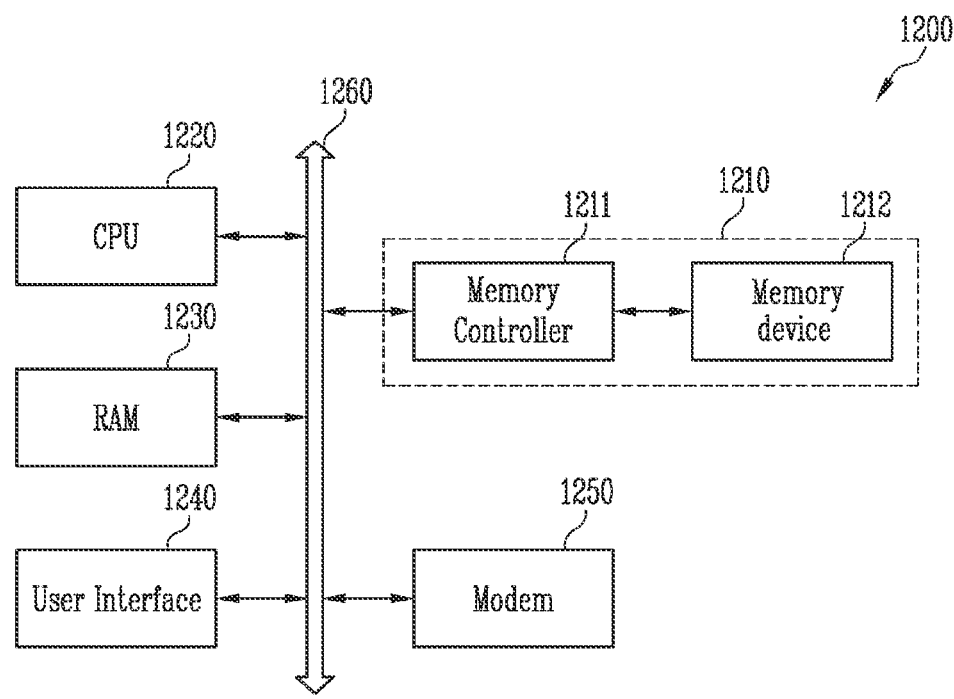
FIG. 14 is a block diagram illustrating the configuration of a computing system according to an embodiment of the present disclosure.

FIG. 14 is a block diagram illustrating the configuration of a computing system 1200 according to an embodiment of the present disclosure.

Referring to FIG. 14, the computing system 1200 may include a CPU 1220, Random Access Memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, an application chipset, a camera image processor (CIS), a mobile DRAM, and the like may be further included.

In a similar manner as described with reference to FIG. 13, the memory system 1210 may include a memory device 1212 and a memory controller 1211.

In a semiconductor device according to embodiments of the present disclosure, a semiconductor layer where a peripheral transistor is formed and a pass gate of a pass transistor may be arranged at the same level, so that the size of the semiconductor device may be reduced.

What is claimed is:
1. A semiconductor device, comprising:
 a stacked body including a conductive pattern and an insulating pattern;
 a cell plug passing through the stacked body;
 a semiconductor layer;

a peripheral transistor coupled to the semiconductor layer;
a first conductor coupling the peripheral transistor to the cell plug;
a second conductor coupled to the conductive pattern;
a pass plug coupled to the second conductor; and
a pass gate surrounding the pass plug,
wherein the pass gate is arranged at substantially a same level as the semiconductor layer.

2. The semiconductor device of claim 1, wherein the semiconductor layer and the pass gate include a same material.

3. The semiconductor device of claim 2, wherein the semiconductor layer and the pass gate include doped silicon.

4. The semiconductor device of claim 1, wherein:
the semiconductor layer includes a first surface on which the peripheral transistor is arranged, and
the pass gate includes a third surface arranged at substantially a same level as the first surface of the semiconductor layer.

5. The semiconductor device of claim 4, wherein a level of a second surface of the semiconductor layer opposing the first surface of the semiconductor layer is at substantially a same as a level of a fourth surface of the pass gate opposing the third surface of the pass gate.

6. The semiconductor device of claim 1, further comprising a separating structure electrically insulating the semiconductor layer from the pass gate.

7. The semiconductor device of claim 6, wherein:
the separating structure includes a first separating layer and a second separating layer in the first separating layer, and
the first separating layer includes an insulating material.

8. The semiconductor device of claim 7, wherein the second separating layer includes a semiconductor material.

9. A semiconductor device, comprising:
a stacked body including a conductive pattern and an insulating pattern;
a cell plug passing through the stacked body;
a semiconductor layer;
a peripheral transistor coupled to the semiconductor layer;
a first conductor coupling the peripheral transistor to the cell plug;
a second conductor coupled to the conductive pattern;
a pass plug coupled to the second conductor; and
a pass gate surrounding the pass plug,
wherein the pass gate includes a same material as the semiconductor layer.

10. The semiconductor device of claim 9, wherein the pass gate and the semiconductor layer include a semiconductor material.

11. The semiconductor device of claim 10, wherein the pass gate and the semiconductor layer include silicon doped with P type impurities.

12. The semiconductor device of claim 9, wherein the first conductor comprises a bit line.

13. The semiconductor device of claim 9, further comprising a separating structure separating the pass gate from the semiconductor layer.

14. The semiconductor device of claim 9, wherein:
the pass plug includes a first pass layer and a second pass layer surrounding the first pass layer, and
the first pass layer is spaced apart from the pass gate by the second pass layer.

15. The semiconductor device of claim 14, wherein:
the first pass layer includes a semiconductor material, and
the second pass layer includes an insulating material.

16. The semiconductor device of claim 15, wherein the first pass layer comprises:
a first portion adjacent to the pass gate;
a second portion arranged above the first portion; and
a third portion arranged under the first portion,
wherein the first portion includes undoped polysilicon, and
wherein the second and third portions include doped polysilicon.

17. A semiconductor device, comprising:
a stacked body including alternately stacked conductive patterns and insulating patterns;
a cell plug passing through the stacked body;
pass plugs electrically coupled to the conductive patterns, respectively, the pass plugs including first pass plugs arranged in a first direction and second pass plugs arranged in the first direction;
a first pass gate surrounding the first pass plugs;
a second pass gate surrounding the second pass plugs; and
a separating structure separating the first pass gate from the second pass gate.

18. The semiconductor device of claim 17, wherein the first pass plugs are spaced apart from the second pass plugs with the separating structure interposed between the first pass plugs and the second pass plugs.

19. The semiconductor device of claim 17, wherein the separating structure includes:
a first separator extending in the first direction; and
a second separator extending in a second direction crossing the first direction.

20. The semiconductor device of claim 17, wherein the conductive patterns include:
a first conductive pattern, wherein the first conductive pattern is coupled to one of the first pass plugs;
a second conductive pattern adjacent to the first conductive pattern, wherein the second conductive pattern is coupled to one of the second pass plugs; and
a third conductive pattern adjacent to the first conductive pattern, wherein the third conductive pattern is coupled to a second pass plug different from the second pass plug coupled to the second conductive pattern.

21. The semiconductor device of claim 20, wherein the first pass plug coupled to the first conductive pattern is arranged between the second pass plug coupled to the second conductive pattern and the second pass plug coupled to the third conductive pattern.

* * * * *